US010158367B1

(12) United States Patent  
Yu et al.

(10) Patent No.: US 10,158,367 B1  
(45) Date of Patent: Dec. 18, 2018

(54) DIGITAL PHASE LOCKED LOOP AND OPERATING METHOD OF DIGITAL PHASE LOCKED LOOP

(71) Applicant: Samsung Electronics Co., Ltd., Suwon-si, Gyeonggi-do (KR)

(72) Inventors: Wonsik Yu, Anyang-si (KR); Wooseok Kim, Suwon-si (KR); Jihyun Kim, Hwaseong-si (KR); Taeik Kim, Seongnam-si (KR); Kangyeop Choo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/861,962

(22) Filed: Jan. 4, 2018

(30) Foreign Application Priority Data

Jun. 21, 2017 (KR) .................. 10-2017-0078746

(51) Int. Cl.

| H03L 7/18 | (2006.01) |
|---|---|
| H03L 7/23 | (2006.01) |
| H03L 7/095 | (2006.01) |
| H03K 5/135 | (2006.01) |

(52) U.S. Cl.
CPC ............ *H03L 7/235* (2013.01); *H03K 5/135* (2013.01); *H03L 7/095* (2013.01); *H03L 7/18* (2013.01); *H03L 2207/08* (2013.01)

(58) Field of Classification Search
CPC ... H03L 7/095; H03L 7/18; H03L 7/22; H03L 7/23; H03L 7/235; H03L 2207/08; H03K 5/135
USPC ................. 327/147, 150, 156, 159
See application file for complete search history.

(56) References Cited

U.S. PATENT DOCUMENTS

| 7,809,345 | B2 | 10/2010 | May |
| 8,054,114 | B2 | 11/2011 | Kuo |
| 8,138,840 | B2 | 3/2012 | Ainspan et al. |
| 8,432,231 | B2 | 4/2013 | Nelson et al. |
| 8,471,611 | B2 | 6/2013 | Sfikas et al. |
| 8,570,107 | B2 | 10/2013 | Guo et al. |
| 9,041,443 | B2 | 5/2015 | Jang et al. |
| 9,337,849 | B2 | 5/2016 | Kim et al. |

(Continued)

OTHER PUBLICATIONS

Pyoungwon Park et al., "A 2.4 GHz Fractional-N Frequency Synthesizer With High-OSR ?S Modulator and Nested PLL", IEEE Journal of Solid-State Circuits, vol. 47, No. 10, Oct. 2012.

*Primary Examiner* — William Hernandez  
(74) *Attorney, Agent, or Firm* — Harness, Dickey & Pierce, P.L.C.

(57) ABSTRACT

A digital phase locked loop includes a digital phase detector, a digital loop filter, a digital controlled oscillator, a first divider that divides the second frequency of the oscillation signal depending on a first division value and outputs the division result as a division signal having a third frequency, a second divider that divides the second frequency of the oscillation signal depending on a second division value and outputs the division result as an output signal having a final frequency, a dithering block that receives the division signal and performs dithering on the first division value based on a preset pattern as cycles of the division signal pass, and a digital phase domain filter that performs second low pass filtering on the division signal in a phase domain and outputs the result of the second low pass filtering as the feedback signal.

20 Claims, 28 Drawing Sheets

(56) References Cited

U.S. PATENT DOCUMENTS

| | | |
|---|---|---|
| 9,401,723 B2 | 7/2016 | Montoriol et al. |
| 9,564,908 B2 | 2/2017 | Song et al. |
| 2003/0224748 A1* | 12/2003 | Gomez ................. H03D 7/161 |
| | | 455/209 |
| 2007/0013447 A1* | 1/2007 | Hirano ................. H03C 3/0925 |
| | | 331/16 |
| 2013/0114771 A1* | 5/2013 | Vavelidis ................. H03L 7/10 |
| | | 375/376 |

* cited by examiner

DIGITAL PHASE LOCKED LOOP AND OPERATING METHOD OF DIGITAL PHASE LOCKED LOOP

CROSS-REFERENCE TO RELATED APPLICATIONS

A claim for priority under 35 U.S.C. § 119 is made to Korean Patent Application No. 10-2017-0078746 filed Jun. 21, 2017, in the Korean Intellectual Property Office, the entire contents of which are hereby incorporated by reference.

BACKGROUND

Example embodiments of the inventive concepts disclosed herein relate to a digital circuit. For example, at least some example embodiments relate to a digital phase locked loop and/or an operating method of the digital phase locked loop.

A phase locked loop generates an output clock locked to an input clock. The phase locked loop is used to transfer a clock in a semiconductor integrated circuit. A supply voltage of the semiconductor integrated circuit may decrease as a semiconductor manufacturing process develops. Also, a permissible range of a leakage current may decrease as the semiconductor manufacturing process develops. A design of a phase locked loop of an analog manner is more difficult due to the above-described limitations.

To solve the difficulty in the design of the analog-type phase locked loop, there is a continuous study on a digital-type phase locked loop replacing the analog-type phase locked loop. In general, a study on the digital-type phase locked loop is being made in such a way that each element of the analog-type phase locked loop is replaced with a digital element. However, an unexpected issue may occur upon combining portions replaced with the digital elements.

SUMMARY

Example embodiments of the inventive concepts provide a digital phase locked loop capable of reducing a noise and/or a spur of an in-band and an out-band due to dithering, and/or an operating method of the digital phase locked loop.

According to some example embodiments, a digital phase locked loop includes a digital phase detector configured to output phase information based on a phase of a reference signal having a reference frequency and a phase of a feedback signal having a first frequency such that the phase information indicates whether the phase of the feedback signal is advanced or delayed with respect to the phase of the reference signal; a digital loop filter configured to perform first low pass filtering on the phase information in a frequency domain, and the digital loop filter configured to output a result of the first low pass filtering as a digital code; a digital controlled oscillator configured to output an oscillation signal having a second frequency, and the digital controlled oscillator configured to adjust a frequency of the oscillation signal based on the digital code; a first divider configured to perform a first division to divide the second frequency of the oscillation signal based on a first division value, and the first divider configured to output a result of the first division as a division signal having a third frequency; a second divider configured to perform a second division to divide the second frequency of the oscillation signal based on a second division value, and the second divider configured to output a result of the second division as an output signal having a final frequency; a dithering block configured to perform, in cycles of the division signal, dithering on the first division value based on a pattern; and a digital phase domain filter configured to perform second low pass filtering on the division signal in a phase domain, and digital phase domain filter configured to output a result of the second low pass filtering as the feedback signal.

According to some example embodiments, a digital phase locked loop includes a digital phase detector configured to output phase information based on a phase of a reference signal having a reference frequency and a phase of a feedback signal having a first frequency such that the phase information indicates whether the phase of the feedback signal is advanced or delayed with respect to the phase of the reference signal; a digital loop filter configured to perform first low pass filtering on the phase information in a frequency domain, and the digital loop filter configured to output a result of the first low pass filtering as a digital code; a digital controlled oscillator configured to output an oscillation signal having a second frequency, and the digital controlled oscillator configured to adjust a frequency of the oscillation signal depending on the digital code; a first divider configured to perform a first division to divide the second frequency of the oscillation signal based on a first division value, and the first divider configured to output a result of the first division as a division signal having a third frequency; a second divider configured to perform a second division to divide the second frequency of the oscillation signal based on a second division value, and the second divider configured to output a result of the second division as an output signal having a final frequency; a dithering block configured to perform dithering, in cycles of the division signal, on the first division value based on a pattern; a digital phase domain filter configured to perform second low pass filtering on the division signal in a phase domain, and digital phase domain filter configured to output the result of the second low pass filtering as a filtered signal; and a third divider configured to perform a third division to divide a frequency of the filtered signal based on a third division value, and the third divider configured to output a result of the third division as the feedback signal.

According to some example embodiments, a method of operating a digital phase locked loop includes generating phase information based on a phase of a reference signal having a reference frequency and a phase of a feedback signal having a first frequency such that the phase information whether the phase of the feedback signal is advanced or delayed with respect to the phase of the reference signal; accumulating, at a digital loop filter of the digital phase locked loop, the phase information to generate a digital code; outputting, at a digital controlled oscillator of the digital phase locked loop, an oscillation signal based on the digital code; performing, at a first divider of the digital phase locked loop, dithering on a first division value and dividing a frequency of the oscillation signal based on the first division value to output a division signal; and performing, at a digital phase domain filter of the digital phase locked loop, low pass filtering on the division signal to generate a next feedback signal of a next clock cycle.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Below, example embodiments of the inventive concepts may be described in detail and clearly to such an extent that an ordinary one in the art easily implements the inventive concepts.

Figure 1:
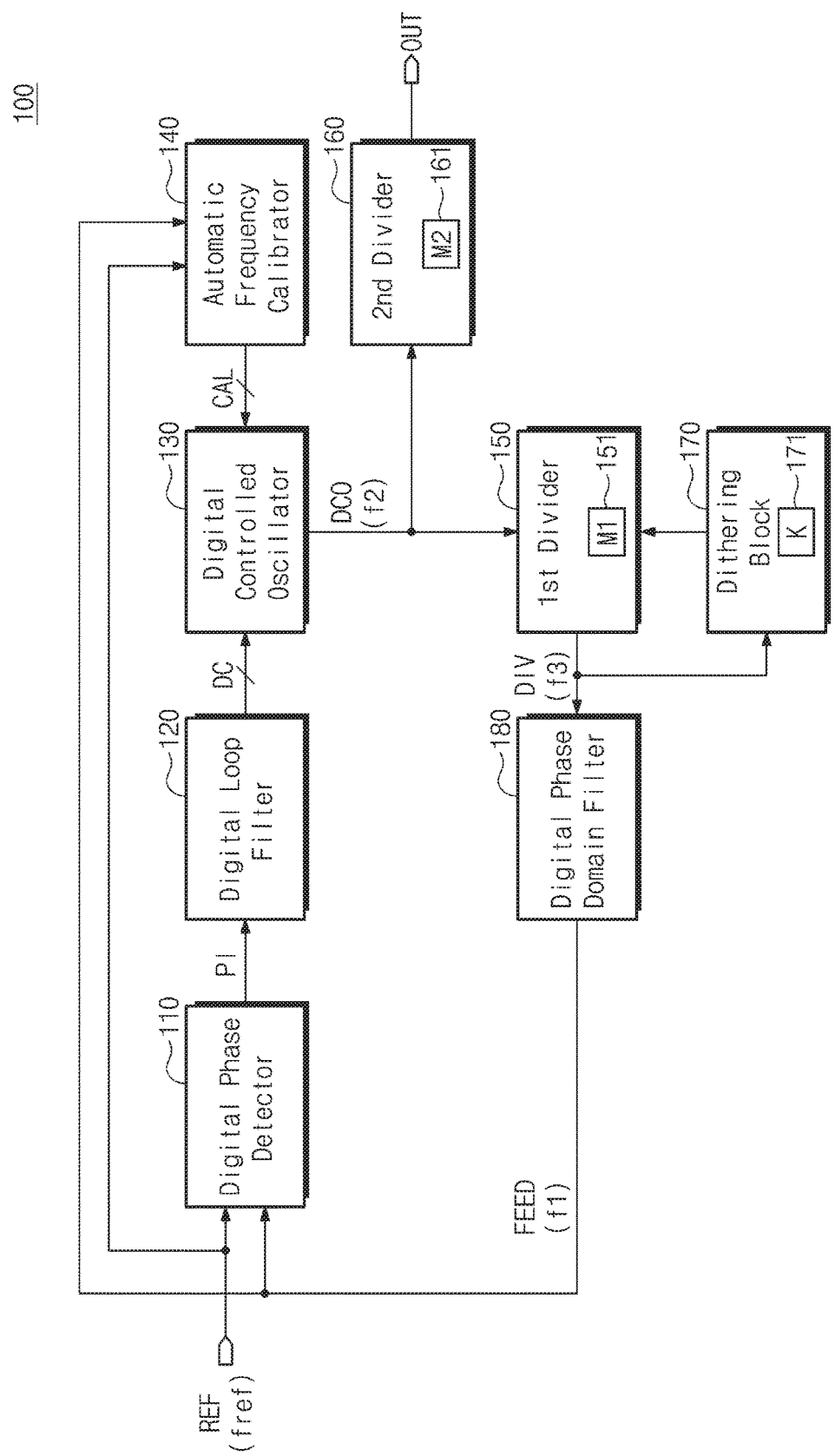
FIG. 1 is a block diagram illustrating a digital phase locked loop according to some example embodiments of the inventive concepts.

FIG. 1 is a block diagram illustrating a digital phase locked loop 100 according to some example embodiments of the inventive concepts.

Referring to FIG. 1, the digital phase locked loop 100 includes a digital phase detector 110, a digital loop filter 120, a digital controlled oscillator 130, an automatic frequency calibrator 140, a first divider 150, a second divider 160, a dithering block 170, a digital phase domain filter 180.

The digital phase detector 110 may receive a reference signal REF from an external device (not illustrated) and may receive a feedback signal FEED from the digital phase domain filter 180. The reference signal REF may have a reference frequency fref, and the feedback signal FEED may have a first frequency f1. The digital phase detector 110 may compare phases of the reference signal REF and the feedback signal FEED.

For example, the digital phase detector 110 may detect whether a phase (e.g., a phase of a rising or falling edge) of the feedback signal FEED is advanced or delayed with respect to a phase (e.g., a phase of a rising or falling edge) of the reference signal REF. For another example, the digital phase detector 110 may detect whether the phase of the reference signal REF is advanced or delayed with respect to the phase of the feedback signal FEED. The digital phase detector 110 may output the comparison result as phase information PI.

The digital loop filter 120 may receive the phase information PI from the digital phase detector 110. The digital loop filter 120 may perform low pass filtering on the phase information PI in a frequency domain. In concept, the digital loop filter 120 may accumulate (or integrate) information, which corresponds to a pass band, of the phase information PI.

The digital loop filter 120 may output the low pass filtering result as a digital code DC. The digital code DC may include two or more bits. For example, the digital loop filter 120 may represent the accumulation result with the specific number of bits and may output the specific number of bits as the digital code DC. Two or more bits of the digital code DC may be respectively transferred to the digital controlled oscillator 130 through different paths.

The digital controlled oscillator 130 outputs an oscillation signal DCO. The oscillation signal DCO may have a second frequency f2. In the beginning in which locking starts, the digital controlled oscillator 130 may adjust the second frequency f2 of the oscillation signal DCO depending on a calibration signal CAL output from the automatic frequency calibrator 140. Afterwards, the digital controlled oscillator 130 may additionally adjust the second frequency f2 of the oscillation signal DCO depending on the digital code DC.

For example, the digital controlled oscillator 130 may adjust the second frequency f2 of the oscillation signal DCO in a first unit depending on the calibration code CAL. The digital controlled oscillator 130 may adjust the second frequency f2 of the oscillation signal DCO in a second unit depending on the digital code DC. The second unit may be smaller than the first unit.

The automatic frequency calibrator 140 receives the reference signal REF and the feedback signal FEED. In the beginning in which locking starts, the automatic frequency calibrator 140 may output the calibration signal CAL depending on a frequency (or phase) difference between the reference signal REF and the feedback signal FEED. The automatic frequency calibrator 140 may adjust the second frequency f2 of the oscillation signal DCO in the first unit to allow the feedback signal FEED to follow the reference signal REF more quickly in the beginning in which calibration starts.

The first divider 150 receives the oscillation signal DCO. The first divider 150 may divide the second frequency f2 of the oscillation signal DCO depending on a first division value M1. The first divider 150 may output the division result as a division signal DIV. The division signal DIV may have a third frequency f3 that is obtained by dividing the second frequency f2 depending on the first division value M1. For example, the first division value M1 may be stored (e.g., in advance) in storage 151 of the first divider 150 or may be loaded onto the storage 151 from an external device (not illustrated) or any other element of the digital phase locked loop 100.

The second divider 160 receives the oscillation signal DCO. The second divider 160 may divide the second frequency f2 of the oscillation signal DCO depending on a second division value M2. The second divider 160 may output the division result as an output signal OUT. The output signal OUT may have an output frequency (fout) that is obtained by dividing the second frequency f2 depending on the second division value M2. For example, the second division value M2 may be stored (e.g., in advance) in storage 161 of the second divider 160 or may be loaded onto the storage 161 from an external device (not illustrated) or any other element of the digital phase locked loop 100.

The dithering block 170 may receive the division signal DIV. As clock cycles of the division signal DIV progress, the dithering block 170 may perform dithering on the first division value M1 by using a control code "K". For example, the dithering block 170 may perform dithering periodically or depending on a specific pattern such that an average of the first division value M1 over time is a value (e.g., a value having a decimal point) not being an integer.

The control code "K" may include two or more bits. For example, the dithering block 170 may be a delta-sigma modulator that performs dithering based on the division signal DIV and the control code "K". The control code "K" may be stored (e.g., in advance) in storage 171 of the dithering block 170 or may be loaded onto the storage 171 from an external device (not illustrated) or any other element of the digital phase locked loop 100.

The digital phase domain filter 180 may receive the division signal DIV. The digital phase domain filter 180 may perform low pass filtering on the division signal DIV in a phase domain. For example, the phase domain may be a domain in which there is represented power for each frequency with respect to a center frequency of the division signal DIV, for example, the third frequency f3. In the phase domain, a frequency axis may be represented with a log scale, that is, to correspond to a phase. The frequency axis may represent a frequency that increases exponentially. The digital phase domain filter 180 may output the filtering result as the feedback signal FEED.

The dithering block 170 may increase a lock-up speed of the digital phase locked loop 100, thereby improving the performance of the digital phase locked loop 100. However, that the dithering block 170 performs dithering on the first division value M1 may cause an in-band noise and a noise and a spur of an out-band in the phase domain. In particular, the out-band spur may cause nonlinearity that locking is released periodically in the digital phase locked loop 100.

To solve such an issue, the digital phase locked loop 100 according to at least some example embodiments of the inventive concepts includes the digital phase domain filter 180. The digital phase domain filter 180 performs low pass filtering in the phase domain, thus suppressing a noise and a spur generated by the dithering block 170. This may mean that reliability of the digital phase locked loop 100 is improved.

In some example embodiments, the automatic frequency calibrator 140 may be optionally omitted from the digital phase locked loop 110 or the automatic frequency calibrator 140 may be combined with the digital controlled oscillator 130. In the case where the automatic frequency calibrator 140 is not included, the digital controlled oscillator 130 may adjust a frequency of the oscillation signal DCO depending on the digital code DC without the calibration signal CAL.

Figure 2:
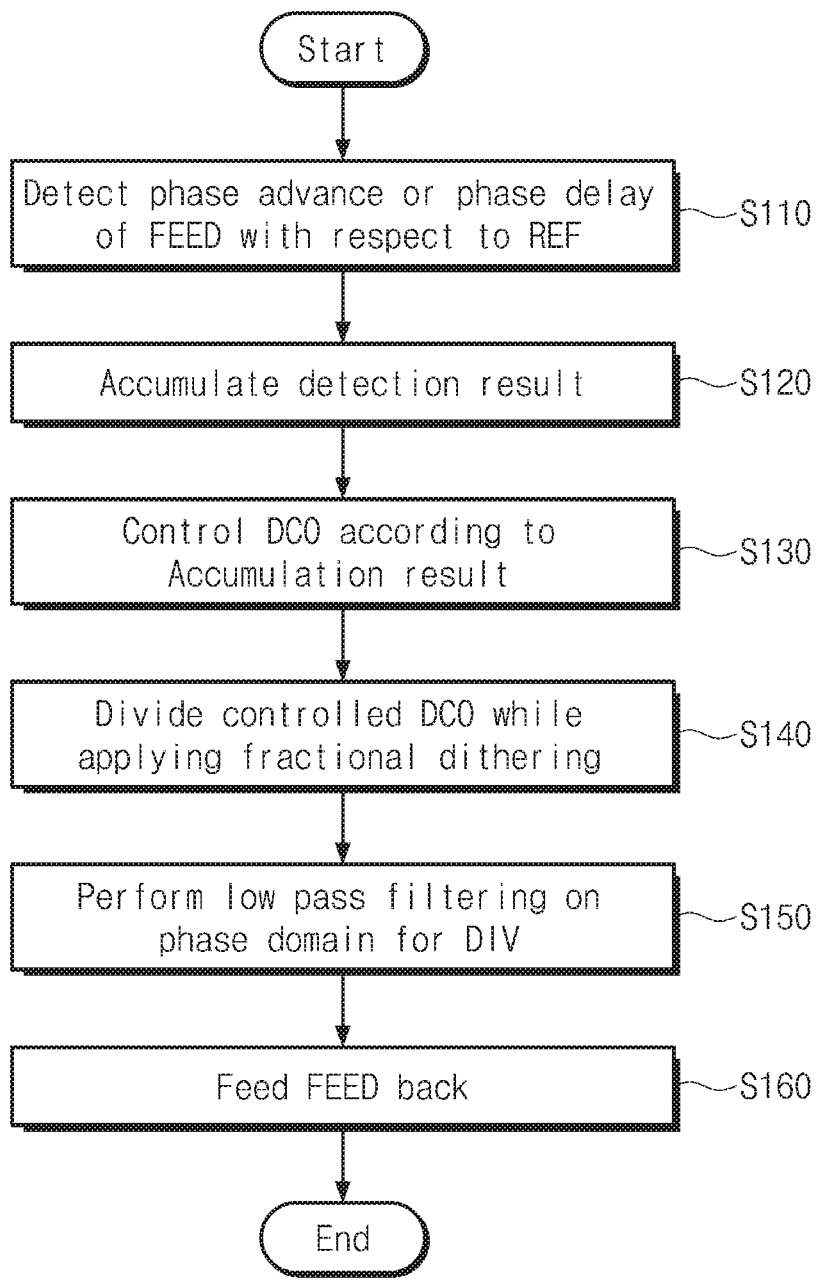
FIG. 2 is a flowchart illustrating an operating method of the digital phase locked loop according to some example embodiments of the inventive concepts.

FIG. 2 is a flowchart illustrating an operating method of the digital phase locked loop 100 according to some example embodiments of the inventive concepts.

Referring to FIGS. 1 and 2, in operation S110, the digital phase detector 110 may detect a phase advance or a phase delay of the feedback signal FEED with respect to the reference signal REF. The detection result is output as the phase information PI.

In operation S120, the digital loop filter 120 may accumulate the detection result. For example, the digital loop filter 120 may accumulate the phase information PI output from the digital phase detector 110. The accumulation result may be output as the digital code DC.

In operation S130, the digital controlled oscillator 130 may control the oscillation signal DCO depending on the accumulation result. For example, the digital controlled oscillator 130 may control the second frequency f2 of the oscillation signal DCO depending on the digital code DC.

For example, in the case where a phase of the feedback signal FEED is advanced with respect to a phase of the reference signal REF, the digital controlled oscillator 130 may decrease the second frequency f2 of the oscillation signal DCO depending on the digital code DC. In the case where a phase of the feedback signal FEED is delayed with respect to a phase of the reference signal REF, the digital controlled oscillator 130 may increase the second frequency f2 of the oscillation signal DCO depending on the digital code DC.

In operation S140, the first divider 150 may apply fractional dithering from the dithering block 170 and may divide the second frequency f2 of the oscillation signal DCO. The division result may be output as the division signal DIV having the third frequency f3.

In operation S150, the digital phase domain filter 180 may perform low pass filtering on the division signal DIV in a phase domain.

A noise and a spur generated by the dithering may be suppressed by the filtering of the digital phase domain filter 180. The filtering result of the digital phase domain filter 180 may be output as the feedback signal FEED.

In operation S160, the feedback signal FEED is fed back to the digital phase detector 110.

Figure 3:
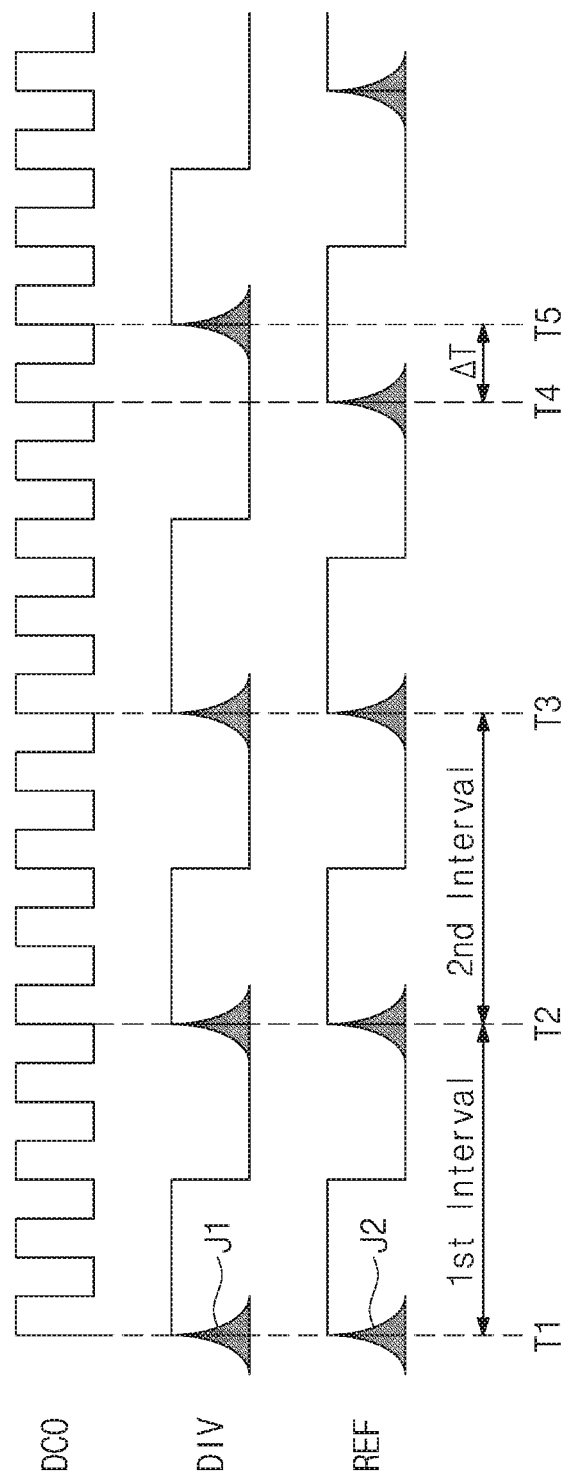
FIG. 3 is a timing diagram illustrating examples of an oscillation signal, a division signal, and a reference signal in the case where a digital phase domain filter does not exist.

FIG. 3 is a timing diagram illustrating examples of the oscillation signal DCO, the division signal DIV, and the reference signal REF in the case where the digital phase domain filter 180 does not exist.

Referring to FIGS. 1 and 3, a frequency of the oscillation signal DCO may be twice a frequency of the reference signal REF. That is, it is assumed that the first division value M1 of the first divider 150 is dithered based on "4".

In a first interval, the first division value M1 may be "4". The division signal DIV may be affected by a jitter of the digital controlled oscillator 130. Accordingly, a rising edge of the division signal DIV may be located depending on the Gaussian probability represented by a first jitter J with respect to a first time point T1. The reference signal REF may be affected by a jitter of a signal source of the reference signal REF. Accordingly, a rising edge of the reference signal REF may be located depending on the Gaussian probability represented by a second jitter J2 with respect to the first time point T1.

In a second interval, the first division value M1 may be "4". Accordingly, rising edges of the division signal DIV and the reference signal REF may be respectively located depending on the Gaussian probability represented by the first and second jitters J1 and J2 with respect to a second time point T2. After the second interval, the first division value M1 may be dithered to "5". That is, a frequency of the division signal DIV may be ⅕ of the oscillation signal DCO.

Accordingly, positions of reference points of the rising edges of the division signal DIV and the reference signal REF may change. The reference signal REF may be located depending on the Gaussian probability represented by the second jitter J2 with respect to a fourth time point T4. The division signal DIV may be located depending on the Gaussian probability represented by the first jitter J1 with respect to a fifth time point T5. That is, a time difference $\Delta T$ may occur between the reference points of the division signal DIV and the reference signal REF by the dithering.

Figure 4:
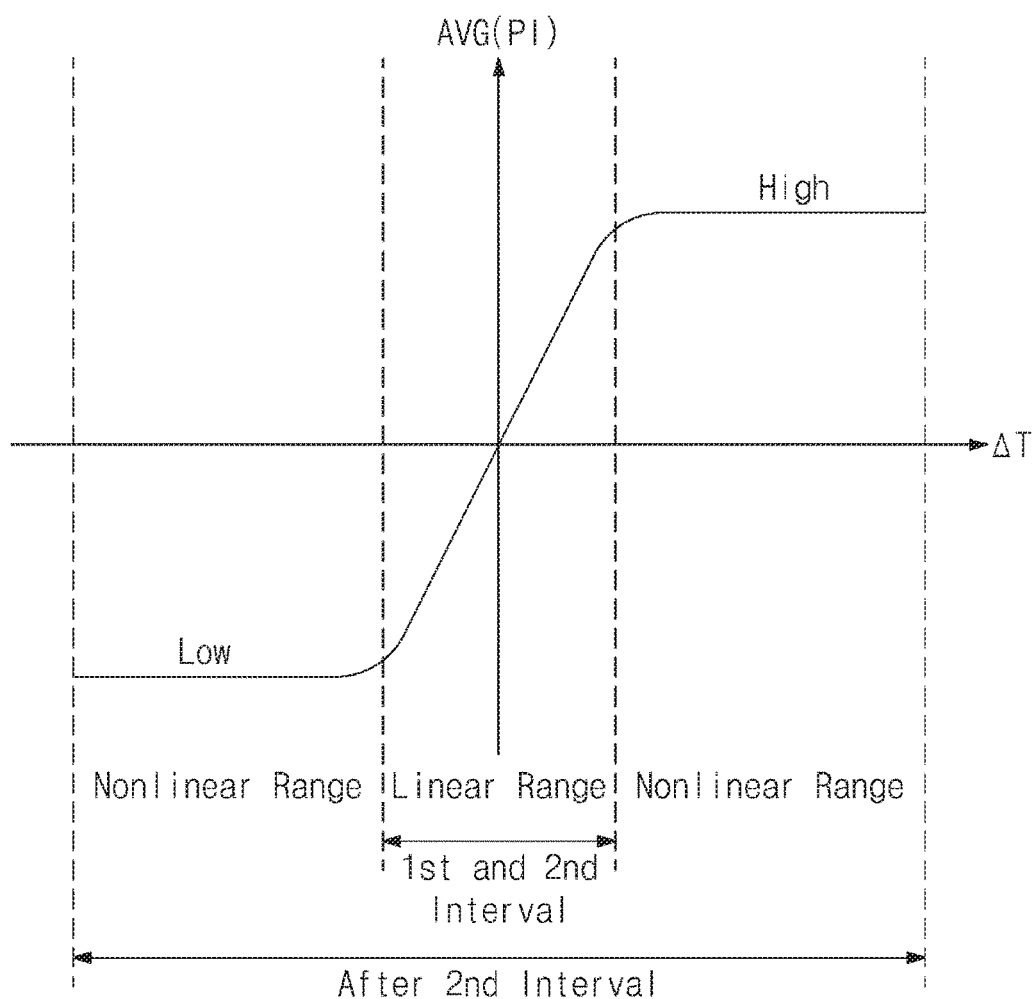
FIG. 4 illustrates an average of phase information that a digital phase detector outputs.

FIG. 4 illustrates an average AVG(PI) of the phase information PI that the digital phase detector 110 outputs. In FIG. 4, a horizontal axis represents a time difference $\Delta T$, and a vertical axis represents the average AVG(PI).

Referring to FIGS. 1, 3, and 4, when a phase of the feedback signal FEED is delayed with respect to a phase of the reference signal REF, the phase information PI may be a high level. When a phase of the feedback signal FEED is advanced with respect to a phase of the reference signal REF, the phase information PI may be a low level.

In the first and second intervals of FIG. 3, a position of a rising edge of the division signal DIV according to the Gaussian probability and a position of a rising edge of the reference signal REF according to the Gaussian probability overlap each other. That is, in the first and second intervals in which the first division value M1 is not adjusted by the dithering, a phase of the feedback signal FEED may be advanced or delayed with respect to a phase of the reference signal REF by the first and second jitters J1 and J2.

That is, the time difference $\Delta T$ may be within an error range represented by the first and second jitters J1 and J2 and may be fixed by following a phase of a digital phase locked loop (PLL). Accordingly, in the case of calculating the average AVG(PI) of the phase information PI over time, as illustrated in FIG. 4, the average AVG(PI) may appear as having linearity between a high level and a low level in the first and second intervals in which the first division value M1 is not adjusted by the dithering.

In contrast, in the case where the second division value M2 is adjusted by the dithering as after the second interval, a position of a rising edge of the division signal DIV according to the Gaussian probability and a position of a rising edge of the reference signal REF according to the Gaussian probability do not overlap each other. Accordingly, when the first division value M1 is adjusted by the dithering, the phase information PI always appears as a high level or a low level. Also, the average AVG(PI) always appears as a high level or a low level.

That is, the event that locking is released may occur when the first division value M1 is adjusted by the dithering (i.e., periodically or depending on a specific pattern). Also, as illustrated in FIG. 4, if the first division value M1 is adjusted by the dithering as after the second interval, the time difference $\Delta T$ is out of a linear range and enters a nonlinear range. Accordingly, the nonlinearity area is included in an operating area of the digital phase locked loop 100. In the case where the nonlinearity area is included in the operating area, the performance of the digital phase locked loop 100 may be reduced.

Figure 5:
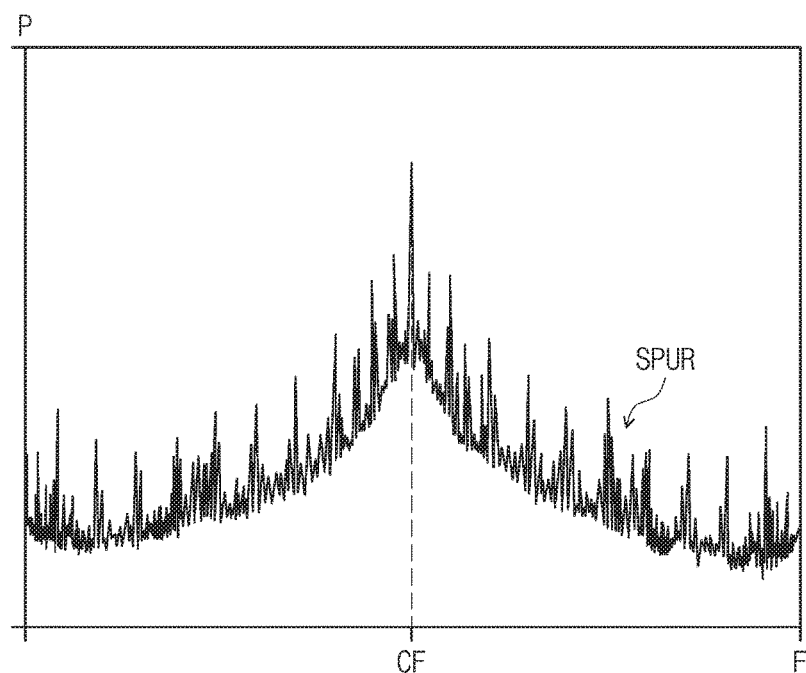
FIG. 5 illustrates an example of a frequency response of the digital phase locked loop in which the digital phase domain filter is not provided.

FIG. 5 illustrates an example of a frequency response of a digital phase locked loop in which the digital phase domain filter 180 is not provided. In FIG. 5, a horizontal axis represents a frequency "F", and a vertical axis represents power "P".

Referring to FIG. 5, a frequency response is symmetrical with respect to a center frequency CF. When a digital phase locked loop operates in a nonlinearity area, a plurality of spurs SPUR may exist.

To allow the digital phase locked loop to operate in the nonlinearity area and noises and spurs SPUR to be prevented from being generated, the digital phase locked loop 100 (refer to FIG. 1) according to at least some embodiments of the inventive concepts includes the digital phase domain filter 180. The digital phase domain filter 180 may perform low pass filtering in a phase domain. The low pass filtering in the phase domain may suppress entrance of the time difference $\Delta T$ to the nonlinearity area, thereby making it possible to suppress noises and spurs SPUR.

Figure 6:
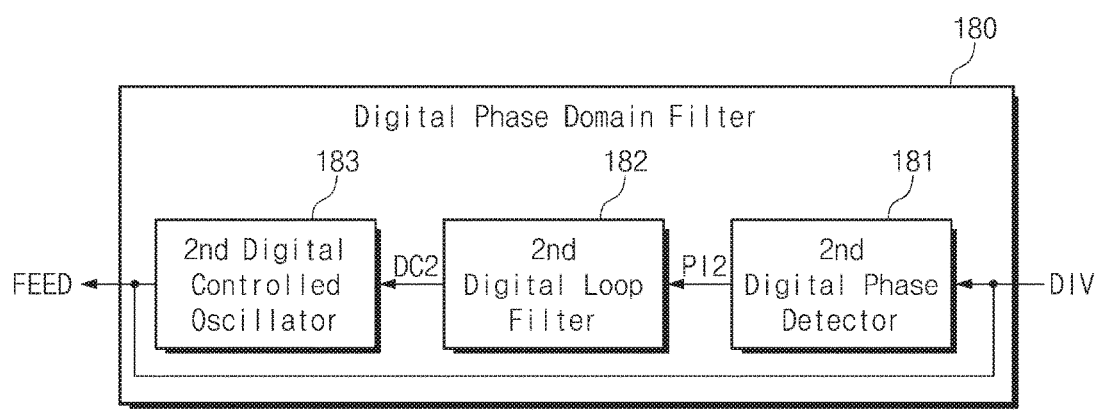
FIG. 6 is a block diagram illustrating an example of the digital phase domain filter according to some example embodiments of the inventive concepts.

FIG. 6 is a block diagram illustrating an example of the digital phase domain filter 180 according to at least some example embodiments of the inventive concepts.

Referring to FIGS. 1 and 6, the digital phase domain filter 180 includes a second digital phase detector 181, a second digital loop filter 182, and a second digital controlled oscillator 183. The second digital phase detector 181 may detect a phase difference of the feedback signal FEED and the division signal DIV.

The second digital phase detector 181 may have the same structure as the digital phase detector 110 or may have a structure different from that of the digital phase detector 110. The second digital loop filter 182 may have the same structure as the digital loop filter 120 or may have a structure different from that of the digital loop filter 120. Bandwidths, orders, and quality factors of the second digital loop filter 182 and the digital loop filter 120 may be the same or different.

A structure of the second digital controlled oscillator 183 may have the same structure as the digital controlled oscillator 130 or may have a structure different from that of the digital controlled oscillator 130. A frequency range of the second digital controlled oscillator 183 may have the same as or different from a frequency range of the digital controlled oscillator 130. The frequency range of the second digital controlled oscillator 183 may be lower than the frequency range of the digital controlled oscillator 130.

Power consumption of the second digital controlled oscillator 183 may be smaller than power consumption of the digital controlled oscillator 130.

The second digital phase detector 181, the second digital loop filter 182, and the second digital controlled oscillator 183 may constitute a digital phase locked loop that outputs the feedback signal FEED having the same frequency as the division signal DIV. A phase locked loop follows a phase of a reference signal (here, the division signal DIV) with a specific time (e.g., an integral time of the second digital loop filter 182). Accordingly, the phase locked loop functions as a low pass filter of a phase domain suppressing a change in a phase of an output signal (here, the feedback signal FEED).

Figure 7:
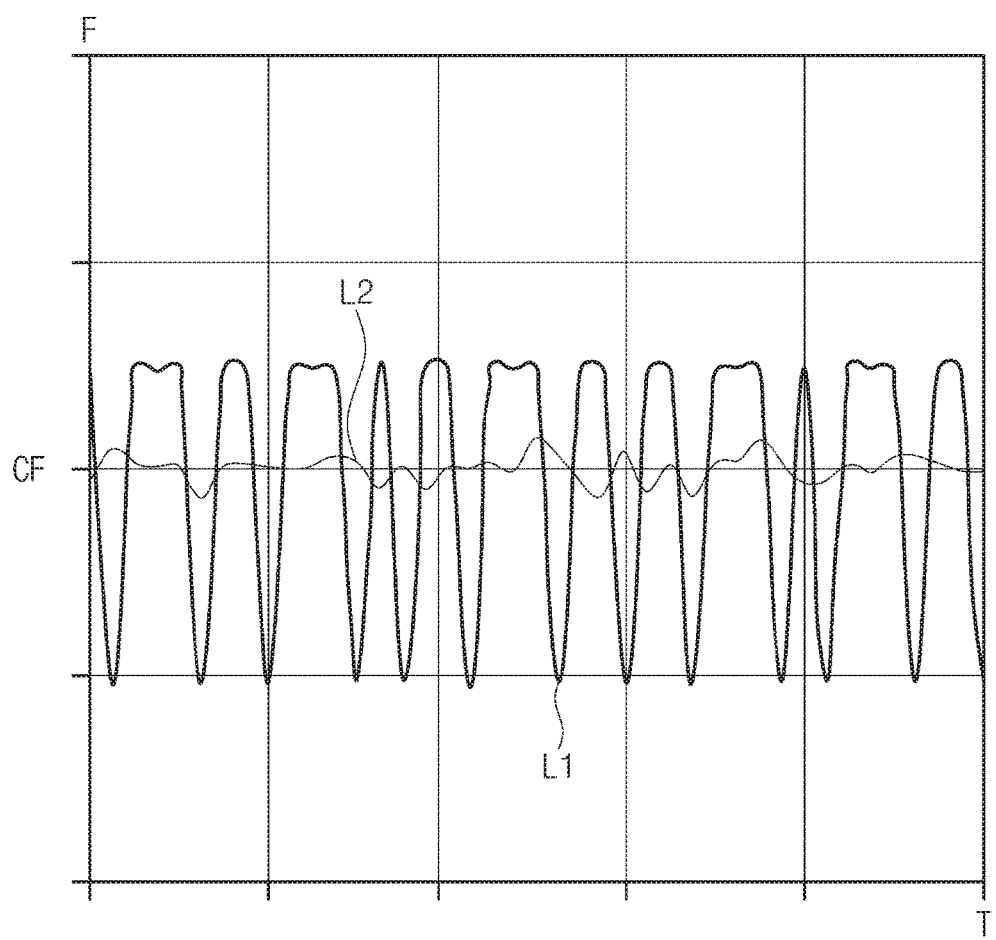
FIG. 7 illustrates a change in a first frequency of a feedback signal over time before and after the digital phase domain filter is applied.

FIG. 7 illustrates a change in the first frequency f1 of the feedback signal FEED over time before and after the digital phase domain filter 180 is applied. In FIG. 7, a horizontal axis represents a time "T", and a vertical axis represents a frequency "F". A first line L1 represents a frequency of a feedback signal before the digital phase domain filter 180 is applied. A second line L2 represents the first frequency f1 of the feedback signal FEED when the digital phase domain filter 180 is applied.

Referring to FIGS. 1 and 7, the first line L1 is illustrated as greatly changing periodically (depending on a pattern) with respect to the center frequency CF. The first line L1 may change due to the event that locking of the digital phase locked loop 100 is released periodically (or depending on a pattern).

The second line L2 shows a change smaller than the first line L1 with respect to the center frequency CF. If the digital phase domain filter 180 is applied, the digital phase locked loop 100 operates only in the linearity area without entering the nonlinearity area. Accordingly, it may be possible to follow the center frequency CF, that is, a reference frequency fref of the reference signal REF while the locking is not released as in the first line L1.

Figure 8:
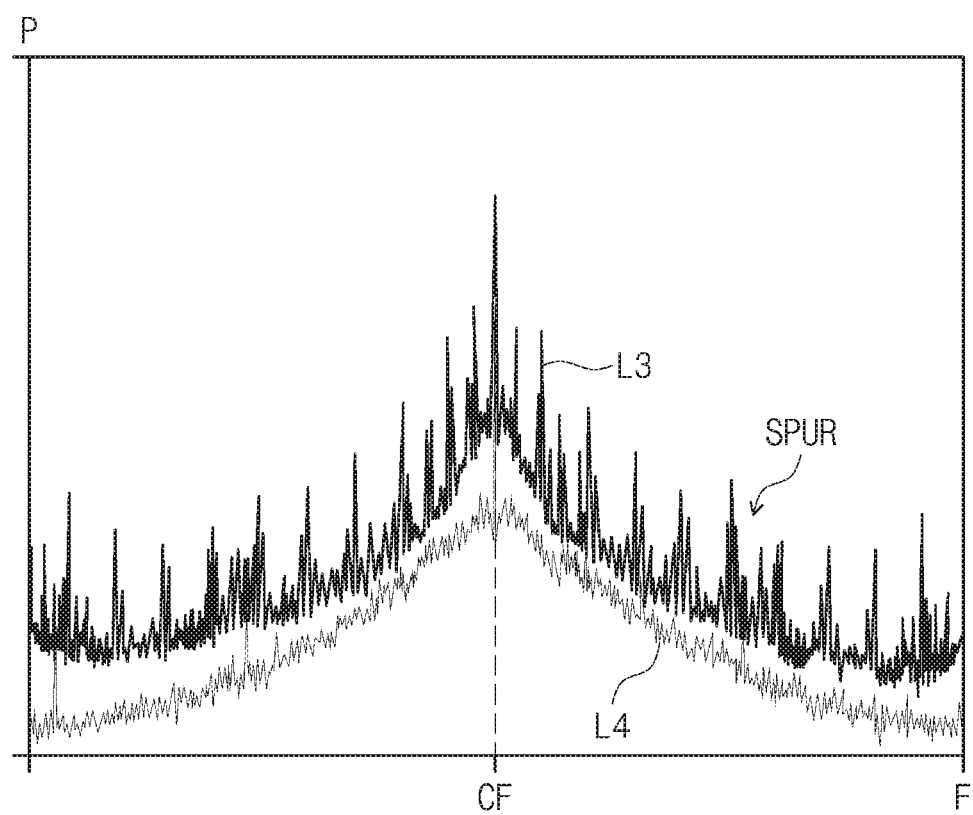
FIG. 8 illustrates an example in which noises and spurs decrease compared with FIG. 5.

FIG. 8 illustrates an example in which noises and spurs SPUR decrease compared with FIG. 5.

Referring to FIG. 8, in FIG. 8, a horizontal axis represents a frequency "F", and a vertical axis represents power "P". A third line L3 shows the same frequency response as illustrated in FIG. 5, and a fourth line L4 shows a frequency response of the digital phase locked loop 100 when the digital phase domain filter 180 is applied. In the case of the fourth line IA, in-band spurs SPUR are improved as much as 35 dB compared with the third line L3.

Figure 9:
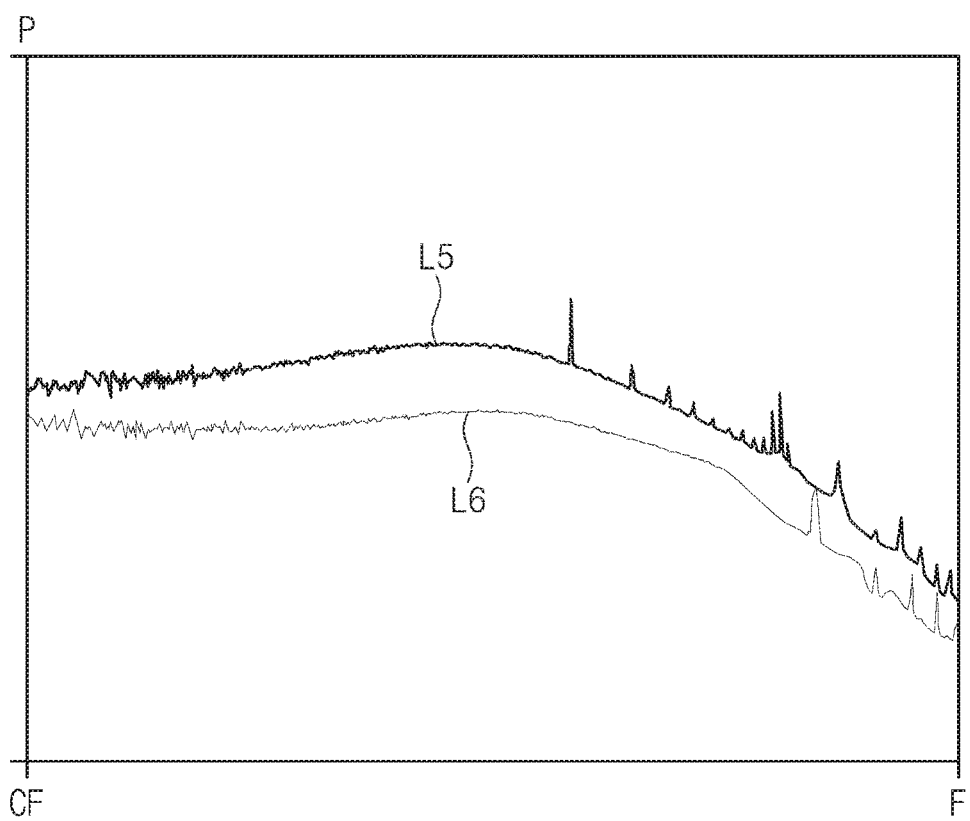
FIG. 9 illustrates an example in which a characteristic of the digital phase locked loop is improved by the digital phase domain filter in a phase domain.

FIG. 9 illustrates an example in which a characteristic of the digital phase locked loop 100 is improved by a digital phase domain filter in a phase domain.

Referring to FIG. 9, in FIG. 9, a horizontal axis represents a frequency "F" increasing in a log scale, and a vertical axis represents power "P" of a noise of the output signal OUT associated with the reference signal REF.

A fifth line L5 illustrates a noise characteristic of a digital phase locked loop to which a digital phase domain filter is not applied. A sixth line L6 illustrates a noise characteristic of the digital phase locked loop 100 to which a digital phase domain filter is applied. As illustrated in FIG. 9, if the digital phase domain filter 180 according to some example embodiments of the inventive concepts is applied, noises and spurs of an in-band and an out-band decrease.

A digital-to-time converter (DTC) may be used to reduce noises and spurs by the dithering of the first division value M1 (refer to FIG. 1). The digital-to-time converter adjusts a delay amount of the division signal DIV under control of compensation logic such that the time difference ΔT (refer to FIG. 3) is shifted to the linearity area (refer to FIG. 4).

A total delay amount of the digital-to-time converter may be the same as one cycle of the reference signal REF. To satisfy the reference, there is a need for a compensation circuit for calculating or setting a delay amount. Also, there is a need for a compensation time for the compensation circuit to calculate or set a delay amount. That is, if the digital-to-time converter is used, an additional, complicated compensation circuit is required, and after a digital phase locked loop starts to operate, the output signal OUT follows the reference signal REF after the compensation time.

In contrast, according to at least some example embodiments of the inventive concepts, the digital phase domain filter 180 may have the same structure as a phase locked loop, thus being implemented simply. Also, if the digital phase domain filter 180 is applied, the output signal OUT follows the reference signal REF immediately after the digital phase locked loop 100 starts to operate. The digital phase locked loop 100 using the digital phase domain filter 180 has lower complexity and a faster locking speed than when the digital-to-time converter is used.

Figure 10:
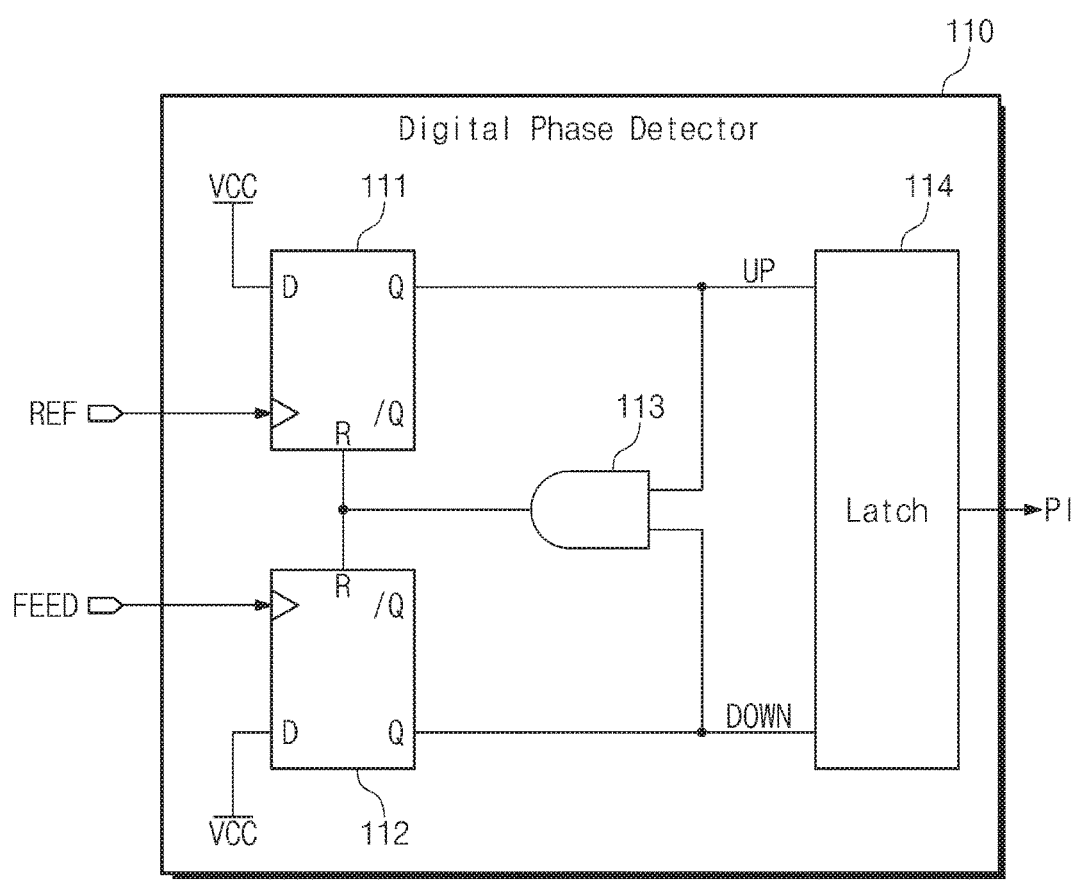
FIG. 10 illustrates an example of the digital phase detector according to some example embodiments of the inventive concepts.

FIG. 10 illustrates an example of the digital phase detector 110 according to some example embodiments of the inventive concepts.

Referring to FIG. 10, the digital phase detector 110 may include a first flip-flop 111, a second flip-flop 112, a logic gate 113, and a latch 114. The first flip-flop 111, the second flip-flop 112, the logic gate 113, and the latch 114 may constitute a bang-bang digital phase detector.

A power supply voltage VCC, that is, logic high may be supplied to an input "D" of the first flip-flop 111. The reference signal REF may be transferred to a clock input of the first flip-flop 111. The power supply voltage VCC, that is, logic high may be supplied to an input "D" of the second flip-flop 112. The feedback signal FEED may be transferred to a clock input of the second flip-flop 112. An output "Q" of the first flip-flop 111 may be an up signal UP. An output "Q" of the second flip-flop 112 may be a down signal DOWN. Inverted outputs/Q of the first and second flip-flops 111 and 112 may not be used.

The logic gate 113 may receive the up signal UP and the down signal DOWN. The logic gate 113 may perform an AND operation on the up signal UP and the down signal DOWN. An output of the logic gate 113 may be transferred to reset inputs "R" of the first and second flip-flops 111 and 112 as a reset signal RST.

The latch 114 may store the up signal UP and the down signal DOWN. For example, the latch 114 may store the up signal UP and the down signal DOWN in synchronization with the reference signal REF or the feedback signal FEED. The latch 114 may output one of the up signal UP and the down signal DOWN, a combination of the up signal UP and the down signal DOWN, or the up signal UP and the down signal DOWN as the phase information PI.

Figure 11:
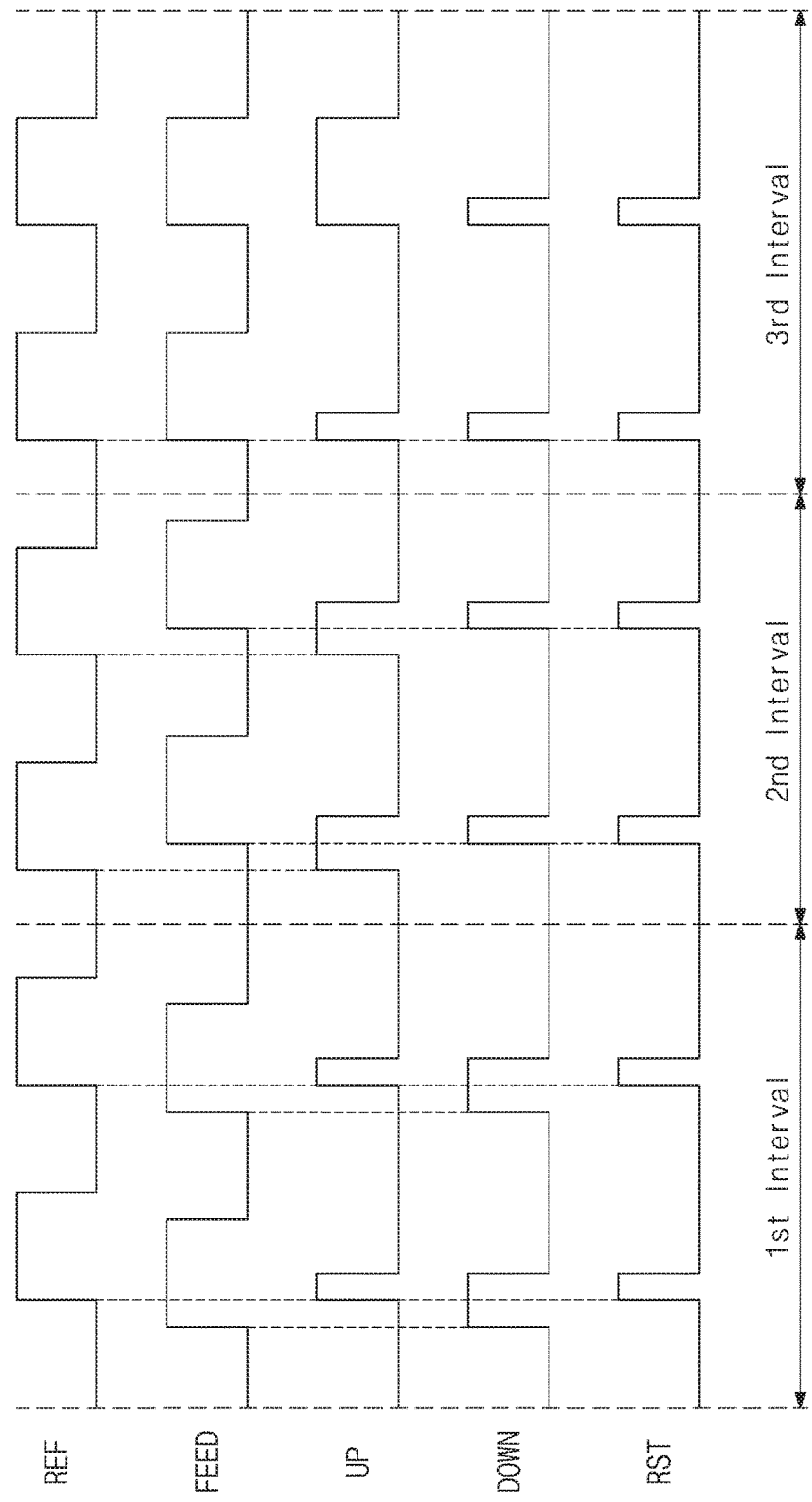
FIG. 11 is a timing diagram illustrating an example in which a phase detector of FIG. 10 operates.

FIG. 11 is a timing diagram illustrating an example in which a phase detector of FIG. 10 operates.

Referring to FIGS. 10 and 11, the reference signal REF, the feedback signal FEED, the up signal UP, the down signal DOWN, and the reset signal RST are illustrated. In a first interval, a phase of the feedback signal FEED may be advanced with respect to a phase of the reference signal REF.

At a rising edge of the feedback signal FEED, the down signal DOWN that is an output of the second flip-flop 112 transition to a high level. At a rising edge of the reference signal REF, the up signal UP that is an output of the first flip-flop 111 transition to a high level. If both the up signal UP and the down signal DOWN are at a high level, the reset signal RST transitions to a high level. If the reset signal RST transitions to a high level, both the up signal UP and the down signal DOWN are reset to a low level.

The down signal DOWN may be a pulse signal that transitions to a high level in synchronization with a rising edge of the feedback signal FEED and transitions to a low level depending on activation of the reset signal RST. The up signal UP may be a pulse signal that transitions to a high level in synchronization with a rising edge of the reference signal REF and transitions to a low level depending on activation of the reset signal RST. Since a phase of the feedback signal FEED is advanced with respect to a phase of the reference signal REF in the first interval, a pulse width of the down signal DOWN may be greater than a pulse width of the up signal UP.

In a second interval, a phase of the feedback signal FEED may be delayed with respect to a phase of the reference signal REF. Accordingly, in the second interval, a pulse width of the down signal DOWN may be smaller than a pulse width of the up signal UP. In a third interval, a phase of the feedback signal FEED and a phase of the reference signal REF coincide with each other. Accordingly, in the third interval, a pulse width of the down signal DOWN and a pulse width of the up signal UP coincide with each other. The latch 114 may store the up signal UP and/or the down signal DOWN in synchronization with the reference signal REF or the feedback signal FEED.

In some example embodiments, it is assumed that the latch 114 stores the up signal UP and/or the down signal DOWN in synchronization with the feedback signal FEED. In the first interval, when the feedback signal FEED is advanced with respect to the reference signal REF, the latch 114 may store "01" as the up and down signals UP and DOWN. In the second interval, when the feedback signal FEED is delayed with respect to the reference signal REF, the latch 114 may store "11" as the up and down signals UP and DOWN.

In some example embodiments, the latch 114 may store the up signal UP and/or the down signal DOWN in synchronization with the reference signal REF. In the first interval, when the feedback signal FEED is advanced with respect to the reference signal REF, the latch 114 may store "11" as the up and down signals UP and DOWN. In the second interval, when the feedback signal FEED is delayed with respect to the reference signal REF, the latch 114 may store "10" as the up and down signals UP and DOWN.

The latch 114 may output the up and down signals UP and DOWN, one of the up and down signals UP and DOWN, or a combination of the up and down signals UP and DOWN as the phase information PI. For example, the latch 114 may calculate a difference between pulse widths of the up and down signals UP and DOWN and may output the calculation result as the phase information PI.

Figure 12:
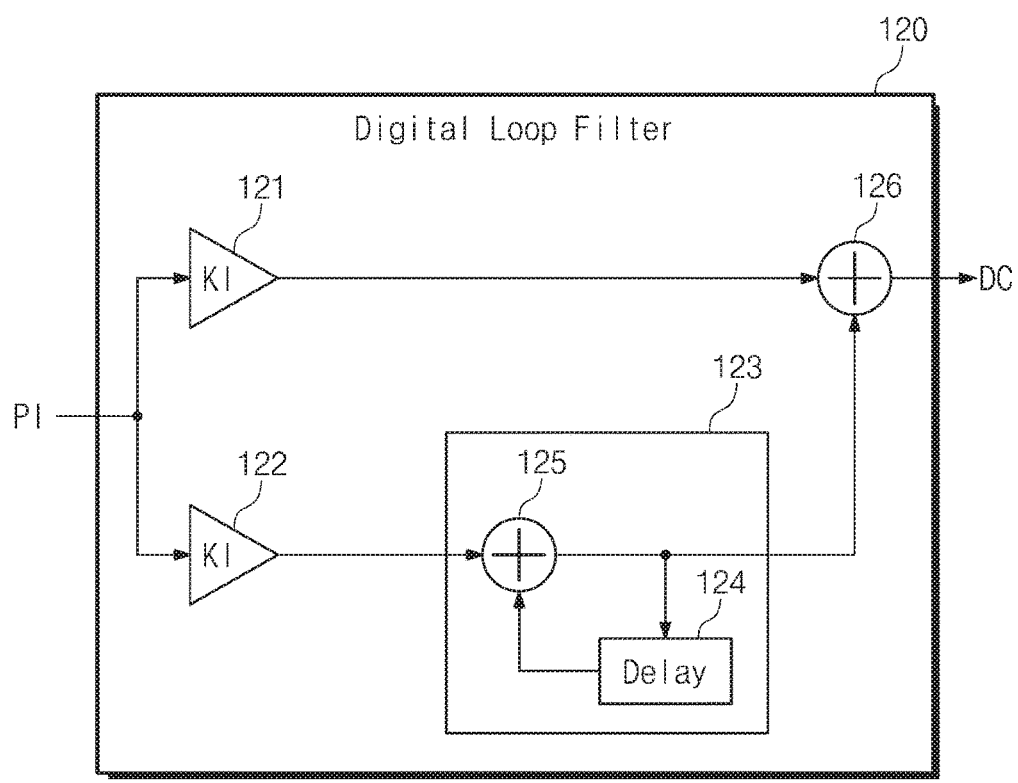
FIG. 12 illustrates an example of a digital loop filter according to some example embodiments of the inventive concepts.

FIG. 12 illustrates an example of the digital loop filter 120 according to some example embodiments of the inventive concepts. In some example embodiments, the second digital loop filter 182 of FIG. 6 may have the same structure as illustrated in FIG. 12.

Referring to FIGS. 1 and 12, the digital loop filter 120 may include a first amplifier 121, a second amplifier 122, an accumulator 123, and an adder 126.

The first amplifier 121 may apply a proportional gain KP to the phase information PI and may output the applying result to the adder 126. The second amplifier 122 may apply an integral gain KI to the phase information PI and may output the result to the accumulator 123. The accumulator 123 may include a delay 124 and an accumulator adder 125.

The accumulator adder 125 may add an output of the second amplifier 122 and an output of the delay 124. An output of the accumulator adder 125 is transferred to the adder 126 and the delay 124. The delay 124 may delay the output of the accumulator adder 125 so as to be fed back to the accumulator adder 125.

The adder 126 may add an output of the first amplifier 121 and an output of the accumulator 123 and may output the digital code DC as the addition result. In an embodiment, the first amplifier 121, the second amplifier 122, the accumulator 123, and the adder 126 may operate in synchronization with the reference signal REF or the feedback signal FEED.

A ratio of the proportional gain KP and the integral gain KI may determine a characteristic of the digital loop filter 120, such as a quality factor. Magnitudes of values of the proportional gain KP and the integral gain KI may determine a bandwidth of the digital loop filter 120. For example, a bandwidth may increase as the values of the proportional gain KP and the integral gain KI become greater. A bandwidth may decrease as the values of the proportional gain KP and the integral gain KI become smaller.

Figure 13:
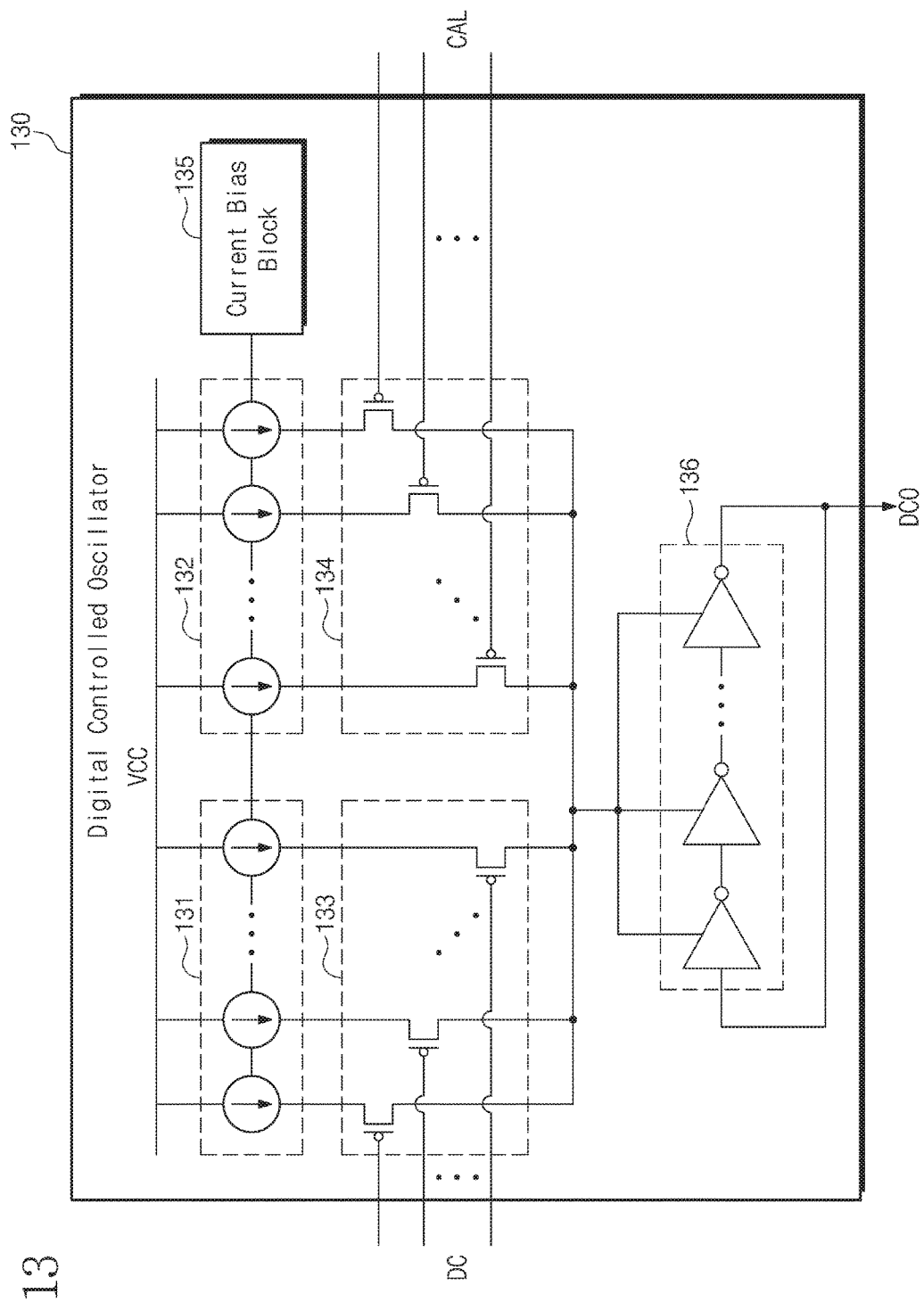
FIG. 13 illustrates an example of a digital controlled oscillator according to some example embodiments of the inventive concepts.

FIG. 13 illustrates an example of the digital controlled oscillator 130 according to at least some example embodiments of the inventive concepts.

Referring to FIGS. 1 and 13, the digital controlled oscillator 130 includes first current sources 131, second current sources 132, first switches 133, second switches 134, a current bias block 135, and inverters 136.

The first current sources 131 are connected between a node supplied with the power supply voltage VCC and the first switches 133. The first current sources 131 may be respectively connected with the first switches 133. The first switches 133 may be controlled by bits of the digital code DC, respectively. That is, the digital code DC may adjust the number of current sources, which supply a current to the inverters 136, from among the first current sources 131.

The second current sources 132 are connected between the node supplied with the power supply voltage VCC and the second switches 134. The second current sources 132 may be respectively connected with the second switches 134. The second switches 134 may be controlled by bits of the calibration signal CAL, respectively. That is, the calibration signal CAL may adjust the number of current sources, which supply a current to the inverters 136, from among the second current sources 132.

The current bias block 135 may adjust the amounts of current of the first current sources 131 and the second current sources 132, respectively. The amounts of current that the first current sources 131 supply may be the same or different. The amounts of current that the second current sources 132 supply may be the same or different. The amount of current that each of the second current sources 132 supplies may be greater than the amount of current that each of the first current sources 131 supplies.

The inverters 136 may be supplied with a current from current sources, which are selected by the first switches 133, from among the first current sources 131 and current sources, which are selected by the second switches 134, from among the second current sources 132. The inverters 136 may operate based on the supplied current. The inverters 136 may operate at a higher frequency if the amount of current increases and may operate at a lower frequency if the amount of current decreases. One of nodes between the inverters 136 may output the oscillation signal DCO. The inverters 136 may constitute a ring oscillator.

Figure 14:
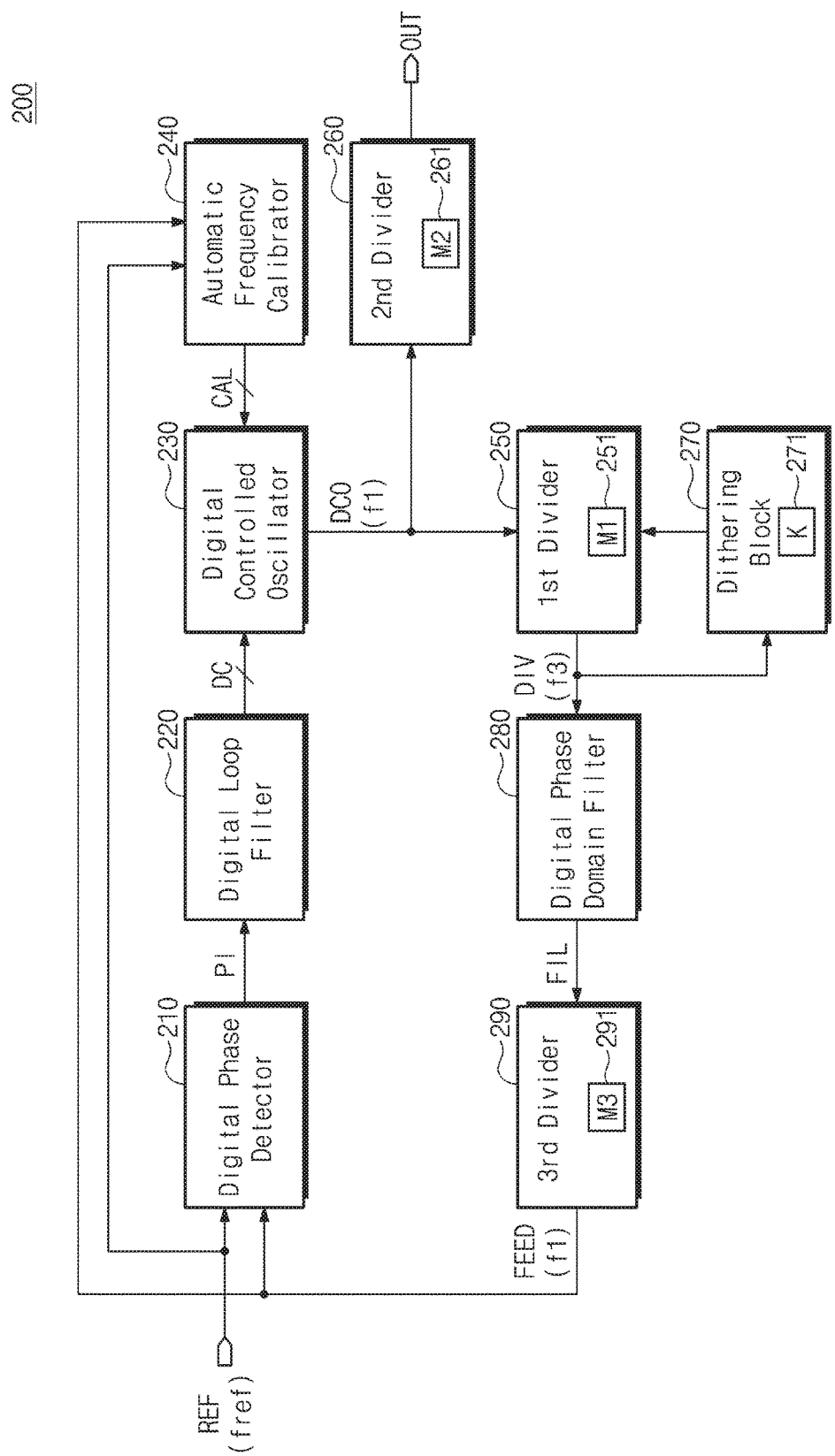
FIG. 14 is a block diagram illustrating the digital phase locked loop according to an application example.

FIG. 14 is a block diagram illustrating a digital phase locked loop 200 according to other example embodiments.

Referring to FIG. 14, the digital phase locked loop 200 includes a digital phase detector 210, a digital loop filter 220, a digital controlled oscillator 230, an automatic frequency calibrator 240, a first divider 250, a second divider 260, a dithering block 270, a digital phase domain filter 280, and a third divider 290.

The first divider 250 may store the first division value M1 in storage 251. The second divider 260 may store the second division value M2 in storage 261. The dithering block 270 may store the control code "K" in storage 271. The third divider 290 may store a third division value M3 in storage 291.

Compared with FIG. 1, the digital phase locked loop 200 further includes the third divider 290. The digital phase domain filter 280 may output a filtered signal FIL. The third divider 290 may divide the filtered signal FIL with the third division value M3. The third divider 290 may output the division result as the feedback signal FEED. For example, the third division value M3 may be stored (e.g., in advance) in the storage 291 of the third divider 290 or may be loaded onto the storage 291 from an external device (not illustrated) or any other element of the digital phase locked loop 200.

A product of the first division value M1 of the first divider 250 and the third division value M3 of the third divider 290 may be the same as the first division value M1 of the first divider 150. If the third division value M3 is applied to the digital phase locked loop 200 by the third divider 290, the first division value M1 of the first divider 250 may decrease with respect to the first division value M1 of the first divider 150 of FIG. 1.

If the first division value M1 decreases, a frequency of the division signal DIV that the first divider 250 outputs is higher than a frequency of the division signal DIV that the first divider 150 of FIG. 1 outputs. Accordingly, a frequency band in which a jitter, a noise, or a spur is added by the dithering of the dithering block 270 is higher than a frequency band in which a jitter, a noise, or a spur is added by the dithering of the dithering block 170 of FIG. 1.

Accordingly, the degree by which a jitter, a noise, or a spur of the division signal DIV output from the first divider 250 is suppressed by the digital phase domain filter 280, in detail, the second digital loop filter 182 (refer to FIG. 6) of the digital phase domain filter 280 is greater than the degree by which a jitter, a noise, or a spur of the division signal DIV output from the first divider 150 of FIG. 1 is suppressed by the digital phase domain filter 180, in detail, the second digital loop filter 182 (refer to FIG. 6) of the digital phase domain filter 180.

In the case where the third divider 290 is provided, a jitter, a noise, or a spur added by the dithering of the dithering block 270 may be suppressed more easily in the digital phase locked loop 200. This may mean that a noise of the digital phase locked loop 200 is further suppressed and the operating performance is further improved.

Figure 15:
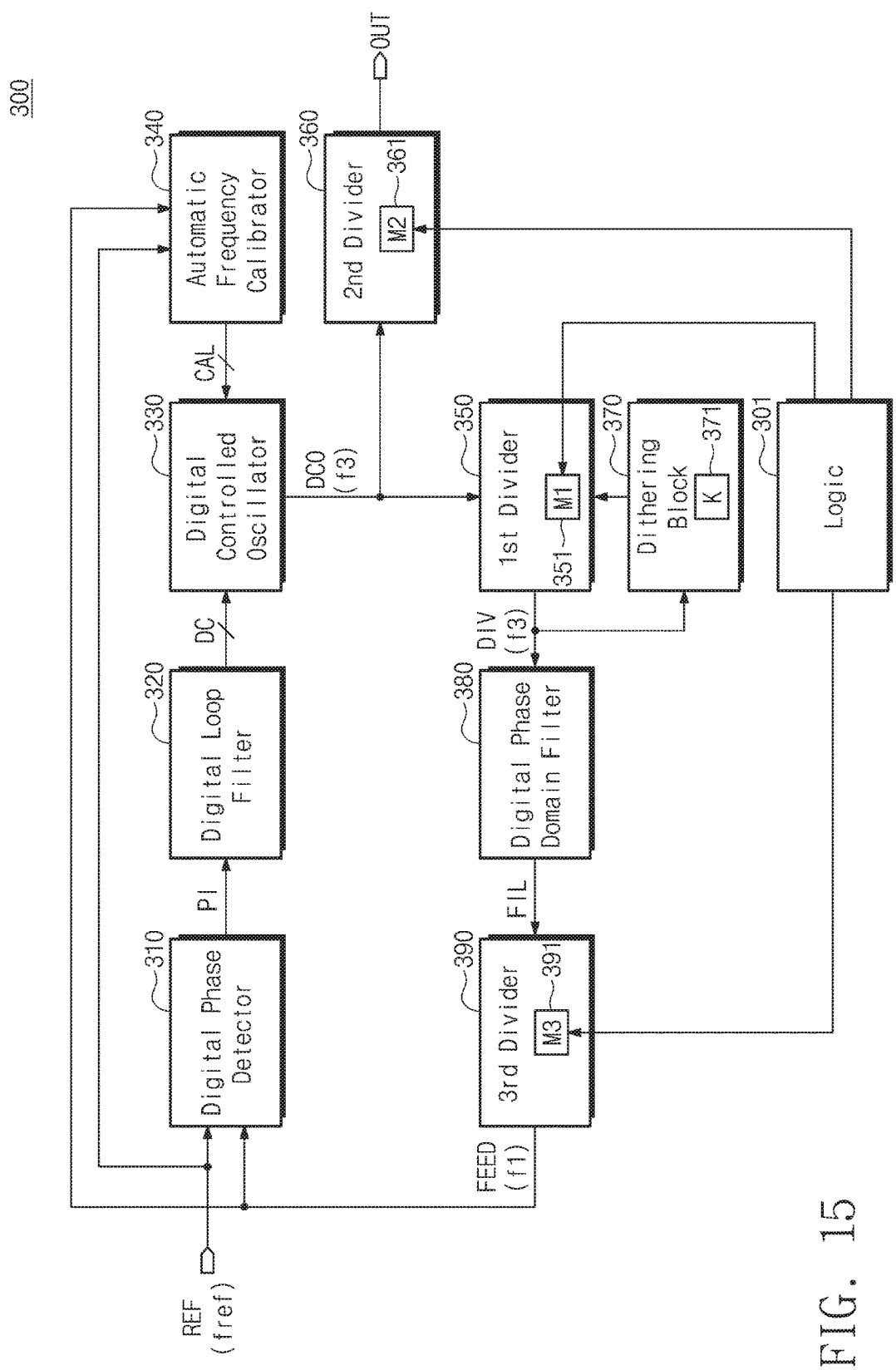
FIG. 15 is a block diagram illustrating the digital phase locked loop according to another application example.

FIG. 15 is a block diagram illustrating a digital phase locked loop 300 according to other example embodiments.

Referring to FIG. 15, the digital phase locked loop 300 includes a digital phase detector 310, a digital loop filter 320, a digital controlled oscillator 330, an automatic frequency calibrator 340, a first divider 350, a second divider 360, a dithering block 370, a digital phase domain filter 380, a third divider 390, and logic 301.

The first divider 350 may store the first division value M1 in storage 351. The second divider 360 may store the second division value M2 in storage 361. The dithering block 370 may store the control code "K" in storage 371. The third divider 390 may store the third division value M3 in storage 391.

Compared with the digital phase locked loop 200 of FIG. 14, the digital phase locked loop 300 further includes the logic 301. The logic 301 may adjust at least one of the first division value M1 of the first divider 350, the second division value M2 of the second divider 360, and the third division value M3 of the third divider 390.

For example, the logic 301 may adjust one of the first to third division values M1 to M3 depending on an internally given algorithm. The logic 301 may adjust one of the first to third division values M1 to M3 depending on a request of an external device or depending on a manipulation of a user.

In some example embodiments, a product of the first and third division values M1 and M3 may be maintained uniformly. In the case where the logic 301 increases or decreases the first division value M1, the logic 301 may decrease or increase the third division value M3 such that a product of the first and third division values M1 and M3 is maintained uniformly.

If the first division value M1 increases and the third division value M3 decreases, a frequency of the division signal DIV may become lower. Accordingly, power consumption of the second digital controlled oscillator 183 (refer to FIG. 6) of the digital phase domain filter 380 may decrease. If the first division value M1 decreases and the third division value M3 increases, a frequency of the division signal DIV may become higher. Accordingly, as described with reference to FIG. 14, a ratio or the quantity of noises or spurs suppressed in the digital phase domain filter 380 may further increase.

Figure 16:
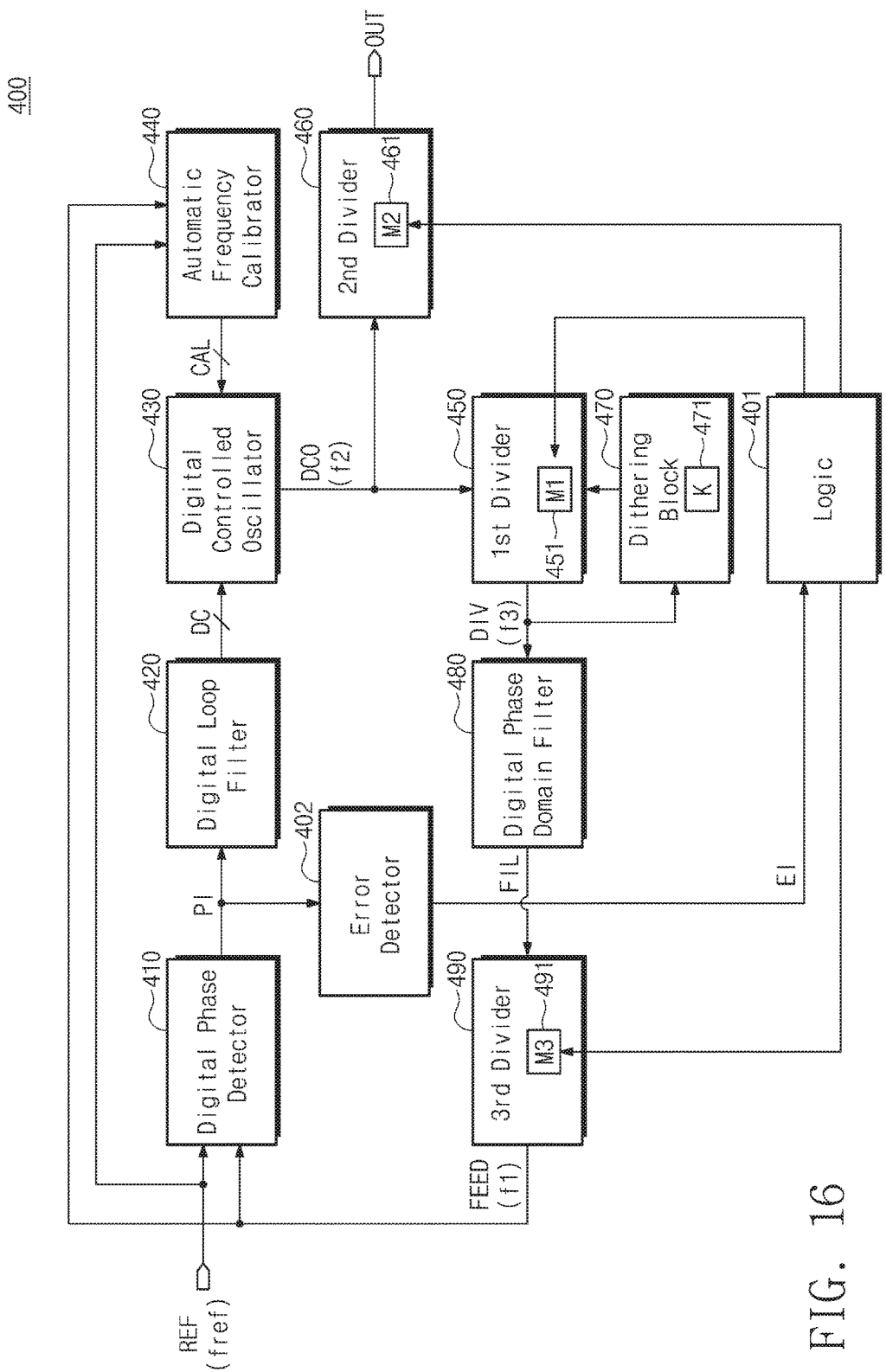
FIG. 16 is a block diagram illustrating the digital phase locked loop according to another application example of the inventive concepts.

FIG. 16 is a block diagram illustrating a digital phase locked loop 400 according to other example embodiments of the inventive concepts.

Referring to FIG. 16, a digital phase locked loop 400 includes a digital phase detector 410, a digital loop filter 420, a digital controlled oscillator 430, an automatic frequency calibrator 440, a first divider 450, a second divider 460, a dithering block 470, a digital phase domain filter 480, a third divider 490, logic 401, and an error detector 402.

The first divider 450 may store the first division value M1 in storage 451. The second divider 460 may store the second division value M2 in storage 461. The dithering block 470 may store the control code "K" in storage 471. The third divider 490 may store a third division value M3 in storage 491.

Compared with the digital phase locked loop 300 of FIG. 15, the digital phase locked loop 400 further includes the error detector 402. The error detector 402 may detect an error from the phase information PI. For example, the error may represent an error of the output signal OUT associated with the reference signal REF. The error may represent a noise or a spur added to the output signal OUT upon locking the output signal OUT to the reference signal REF.

For example, the error detector 402 may detect the error by calculating an accumulated sum or an accumulated average of the phase information PI or by comparing a value of a specific clock cycle of the phase information PI and a value of a previous clock cycle of the specific clock cycle. The error detector 402 may output error information EI representing the detected error. The error information EI may represent, as a value, an error or an accumulated error during a current clock cycle or the specific number of recent clock cycles.

The logic 401 may receive the error information EI from the error detector 402. The logic 401 may adjust one of the first to third division values M1 to M3 depending on the error information EI. In detail, the logic 401 may adjust the first and third division values M1 and M3 depending on the error information EI while maintaining a product of the first and third division values M1 and M3.

Figure 17:
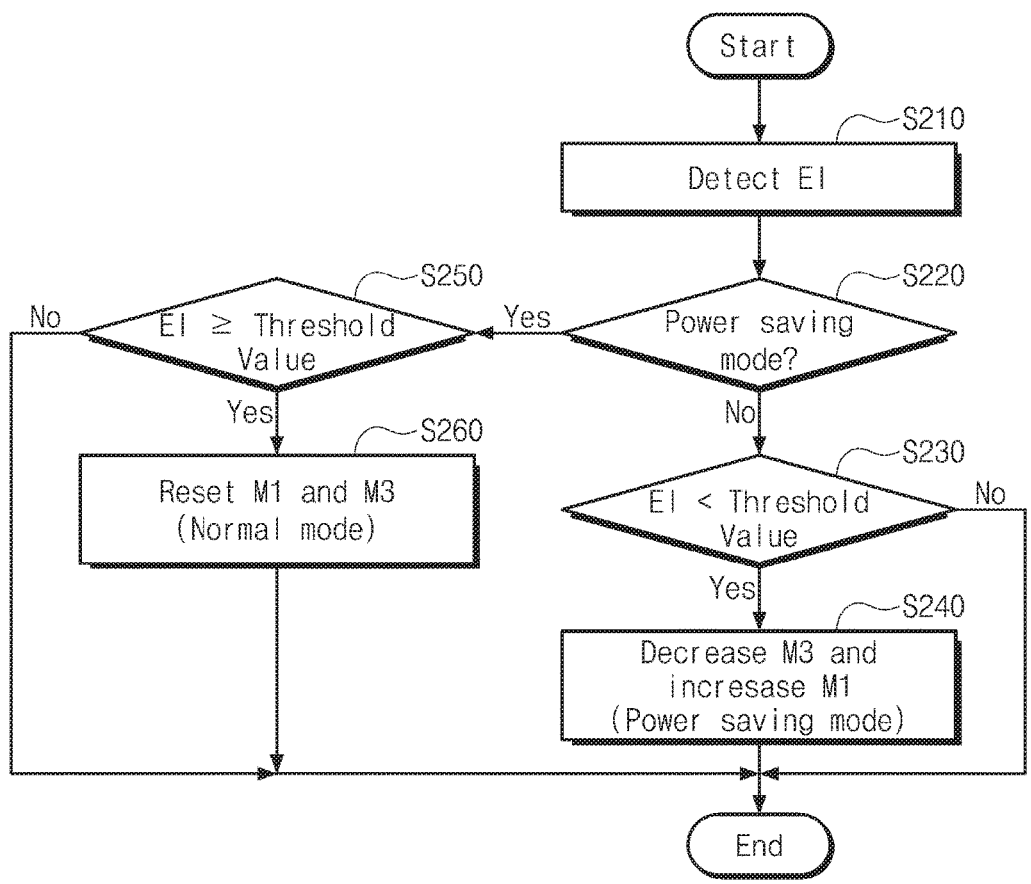
FIG. 17 is a flowchart illustrating an operating method of the digital phase locked loop of FIG. 16.

FIG. 17 is a flowchart illustrating an operating method of the digital phase locked loop 400 of FIG. 16.

Referring to FIGS. 16 and 17, in operation S210, the error detector 402 may detect the error information EI. The detected error information EI may be transferred to the logic 401. In operation S220, the logic 401 determines whether a current operating mode is a power saving mode. If the current operating mode is the power saving mode, operation S250 is performed. If the current operating mode is not the power saving mode, operation S230 is performed.

If the current operating mode is the normal mode, in operation S230, the logic 401 may compare the error information EI with a threshold value. The threshold value may be stored (e.g., in advance) in the logic 401. The threshold value may be a value that is set in the logic 401 by an external device or a user. If the error information EI is not smaller than the threshold value, the logic 401 may maintain a normal mode and may not change an operating mode.

If the error information EI is smaller than the threshold value, in operation S240, the logic 401 may allow the digital phase locked loop 400 to enter the power saving mode. For example, while maintaining a product of the first and third division values M1 and M3, the logic 401 may decrease the third division value M3 and may increase the first division value M1. If the third division value M3 decreases, power consumption of the second digital controlled oscillator 183 (refer to FIG. 6) of the digital phase domain filter 480 may decrease.

If the current operating mode is the power saving mode, in operation S250, the logic 401 may determine whether the error information EI is the same as or greater than the threshold value. If the error information EI is smaller than the threshold value, the logic 401 may maintain the power saving mode and may not change an operating mode. If the error information EI is the same as or greater than the threshold value, the logic 401 may enter the normal mode. For example, the logic 401 may reset the first and third division values M1 and M3.

In an embodiment, a description is given in FIGS. 15 and 16 as the logic 301 or 401 adjusts at least one of the first to third division values M1 to M3. In addition to the above description, the logic 301 or 401 may stepwise adjust at least one of the first to third division values M1 to M3. For example, in FIG. 16, the logic 401 may stepwise adjust (e.g., increase or decrease) the first and third division values M1 and M3 depending on a range to which a value of the error information EI belongs.

In some example embodiments, the flowchart illustrated in FIG. 17 may be performed during one clock cycle (e.g., a clock cycle of the reference signal REF or the feedback signal FEED) in which the digital phase locked loop 400 operates. In a next clock cycle, the logic 401 may select an operating mode depending on the flowchart illustrated in FIG. 17.

In other example embodiments, the error detector 402 may accumulate the error information EI during the specific number of clock cycles in which the digital phase locked loop 400 operates. The logic 401 may select an operating mode depending on the accumulated error information EI. That is, the selection of the operating mode may be performed once during the specific number of clock cycles of the reference signal REF or the feedback signal FEED.

As described above, if the error information EI is smaller than the threshold value, the logic 401 may allow the digital phase locked loop 400 to enter the power saving mode. If the error information EI is the same as or greater than the threshold value, the logic 401 may allow the digital phase locked loop 400 to enter the normal mode.

The terms "normal mode" and "power saving mode" are used to distinguish operating modes of the digital phase locked loop 400 and are not intended to limit the scope and spirit of example embodiments of the inventive concepts. For example, the "normal mode" may be referred to as a "noise suppression mode" in terms of suppressing more noises than in the "power saving mode". Also, the "power saving mode" may be referred to as a "normal mode" compared with the noise suppression mode".

Figure 18:
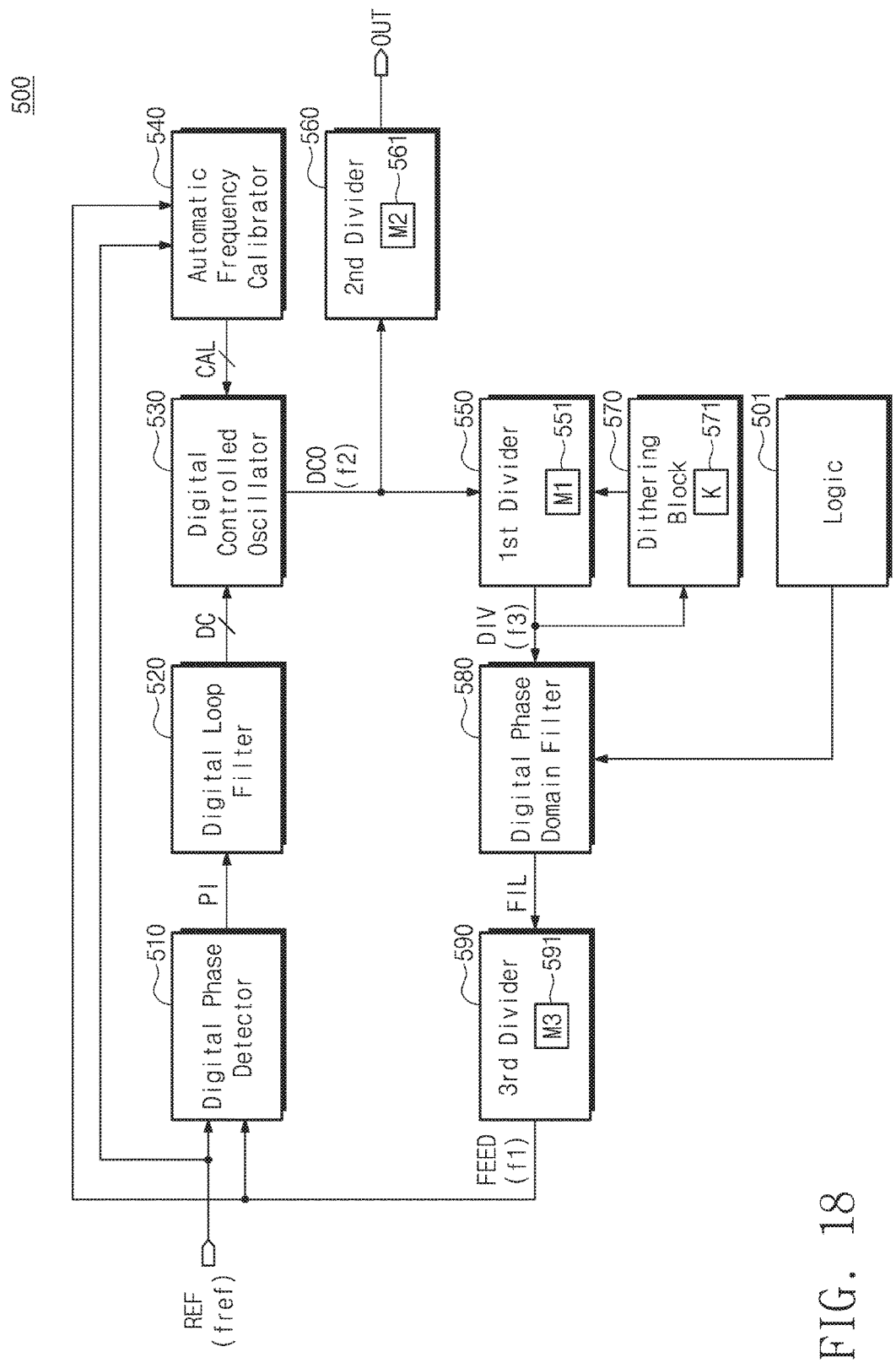
FIG. 18 is a block diagram illustrating the digital phase locked loop according to an application example of the digital phase locked loop of FIG. 15.

FIG. 18 is a block diagram illustrating a digital phase locked loop 500 according to other example embodiments of the inventive concepts.

Referring to FIG. 18, the digital phase locked loop 500 includes a digital phase detector 510, a digital loop filter 520, a digital controlled oscillator 530, an automatic frequency calibrator 540, a first divider 550, a second divider 560, a dithering block 570, a digital phase domain filter 580, a third divider 590, and logic 501.

The first divider 550 may store the first division value M1 in storage 551. The second divider 560 may store the second division value M2 in storage 561. The dithering block 570 may store the control code "K" in storage 571. The third divider 590 may store the third division value M3 in storage 591.

Compared with the digital phase locked loop 300 of FIG. 15, the logic 501 may not adjust the first to third division values M1 to M3 in the digital phase locked loop 500. The logic 501 of the digital phase locked loop 500 may control the digital phase domain filter 580.

Figure 19:
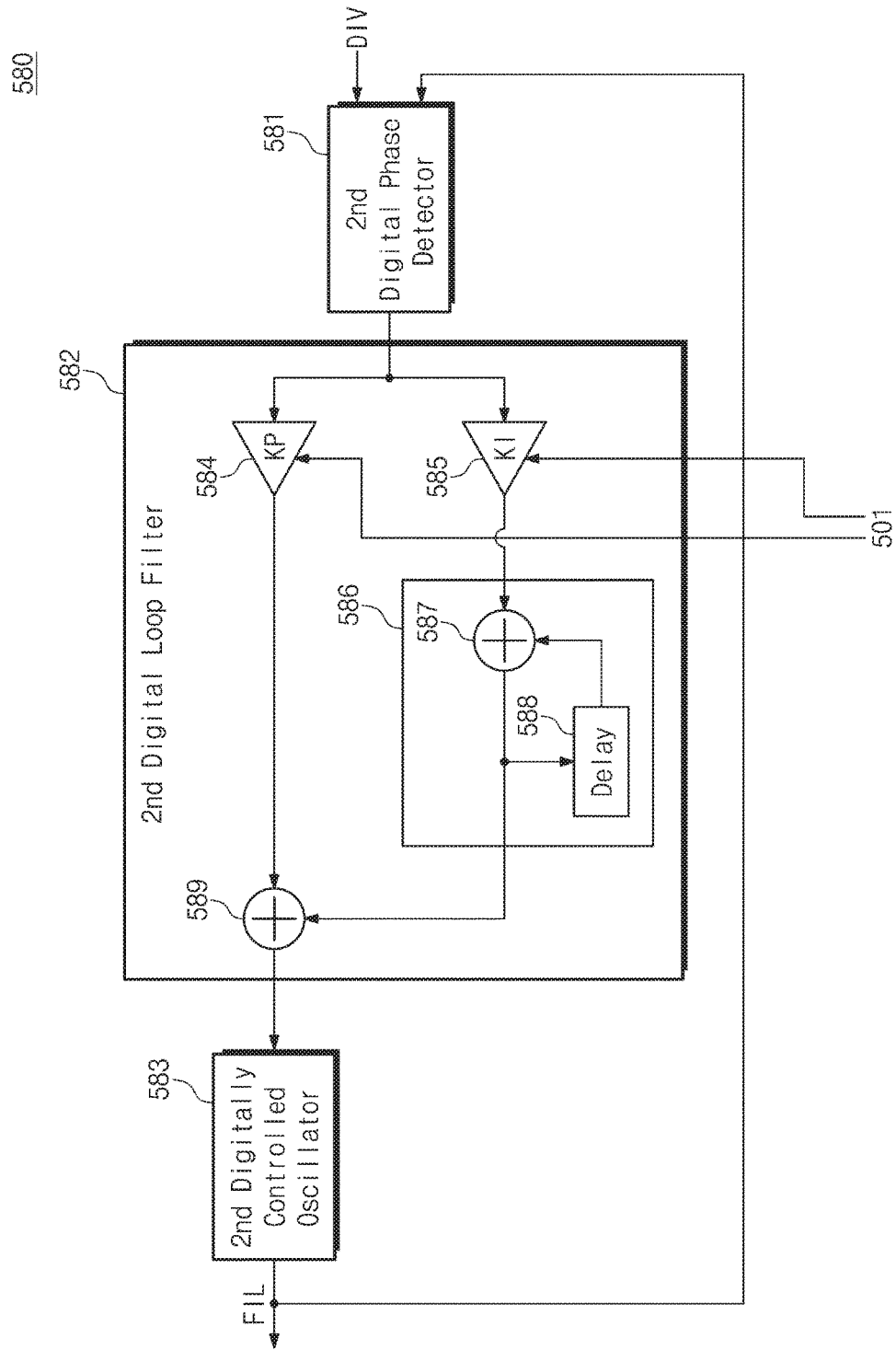
FIG. 19 illustrates an example of the digital phase domain filter of the digital phase locked loop of FIG. 18.

FIG. 19 illustrates an example of the digital phase domain filter 580 of the digital phase locked loop 500 of FIG. 18.

Referring to FIGS. 18 and 19, the digital phase domain filter 580 includes a second digital phase detector 581, a second digital loop filter 582, and a second digital controlled oscillator 583.

The second digital phase detector 581 and the second digital controlled oscillator 583 may operate the same as described with reference to the second digital phase detector 181 and the second digital controlled oscillator 183 of FIG. 6, and a description thereof is thus omitted. The second digital loop filter 582 may include first and second amplifiers 584 and 585, an adder 589, and an accumulator 586. The accumulator 586 may include an accumulator adder 587 and a delay 588. The second digital loop filter 582 may operate the same as the second digital loop filter 182 described with reference to FIGS. 6 and to 12, and a description thereof is thus omitted.

The logic 501 may adjust the proportional gain KP of the first amplifier 584 and the integral gain KI of the second amplifier 585. For example, the logic 501 may increase or decrease the proportional gain KP and the integral gain KI while maintaining a ratio of the proportional gain KP to the integral gain KI uniformly.

If the proportional gain KP and the integral gain KI increase, a bandwidth of the second digital loop filter 582 increases. If the bandwidth increases, a greater portion of information about a phase difference of the division signal DIV and the filtered signal FIL may be transferred to the second digital controlled oscillator 583 through the second digital loop filter 582. Accordingly, a response time taken for the output signal OUT of the digital phase locked loop 500 to follow the reference signal REF decreases.

If the proportional gain KP and the integral gain KI decrease, a bandwidth of the second digital loop filter 582 decreases. If the bandwidth decreases, a greater portion of a noise and a spur present in the phase difference of the division signal DIV and the filtered signal FIL may be blocked by the second digital loop filter 582. Accordingly, an error of the output signal OUT of the digital phase locked loop 500 with regard to the reference signal REF decreases.

Figure 20:
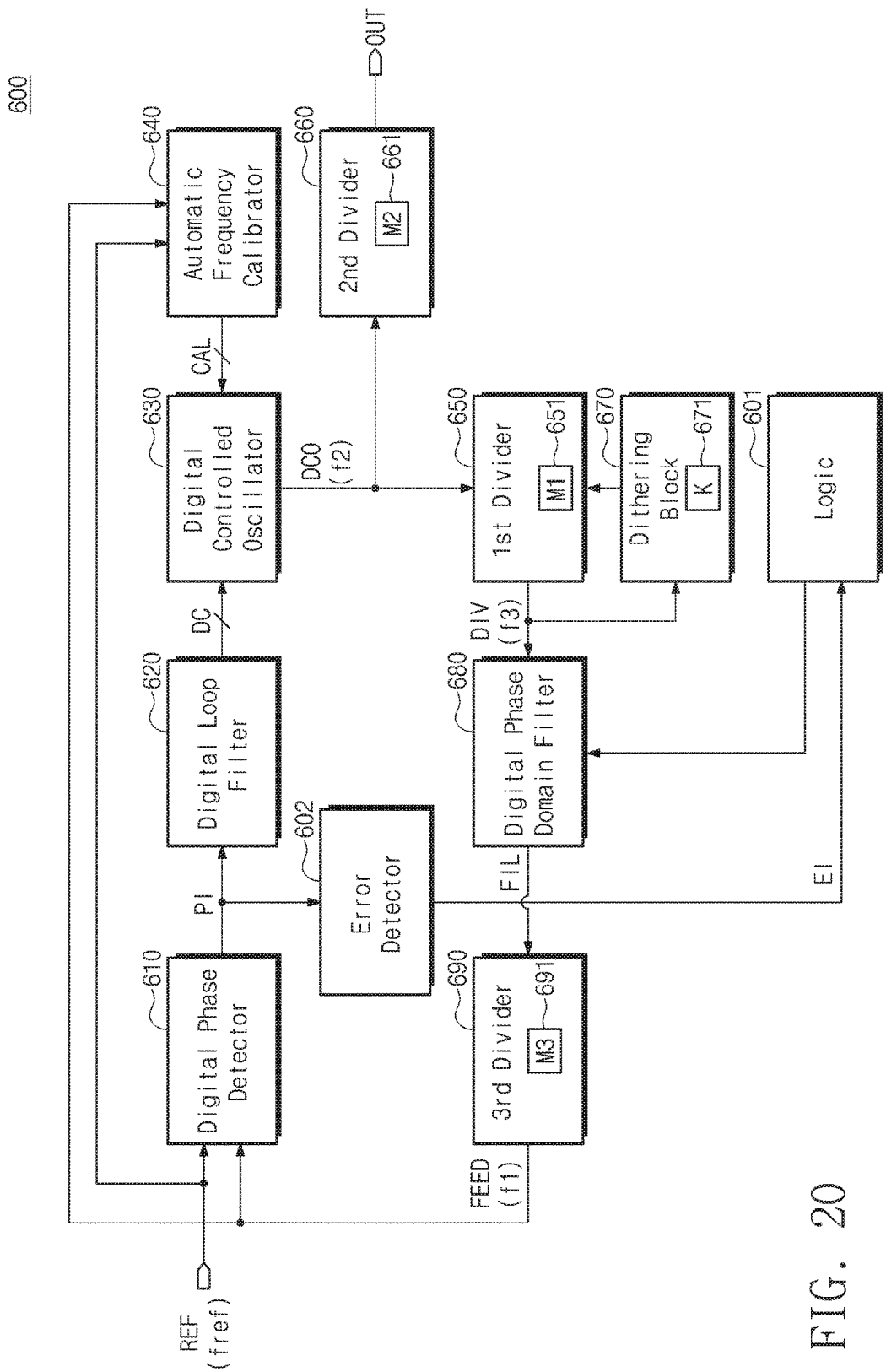
FIG. 20 is a block diagram illustrating the digital phase locked loop according to an application example of the digital phase locked loop of FIG. 19.

FIG. 20 is a block diagram illustrating a digital phase locked loop 600 according to other example embodiments of the inventive concepts.

Referring to FIG. 20, the digital phase locked loop 600 includes a digital phase detector 610, a digital loop filter 620, a digital controlled oscillator 630, an automatic frequency calibrator 640, a first divider 650, a second divider 660, a dithering block 670, a digital phase domain filter 680, a third divider 690, logic 601, and an error detector 602.

The first divider 650 may store the first division value M1 in storage 651. The second divider 660 may store the second division value M2 in storage 661. The dithering block 670 may store the control code "K" in storage 671. The third divider 690 may store a third division value M3 in storage 691.

Compared with the digital phase locked loop 500 of FIG. 18, the digital phase locked loop 600 further includes the error detector 602. As described with reference to FIG. 16, the error detector 602 may detect an error from the phase information PI. For example, the error may represent an error of the output signal OUT associated with the reference signal REF.

The logic 601 may receive the error information EI from the error detector 602. The logic 601 may adjust the digital phase domain filter 680 depending on the error information EI. In detail, the logic 601 may adjust a bandwidth of the second digital loop filter 582 of the digital phase domain filter 680.

Figure 21:
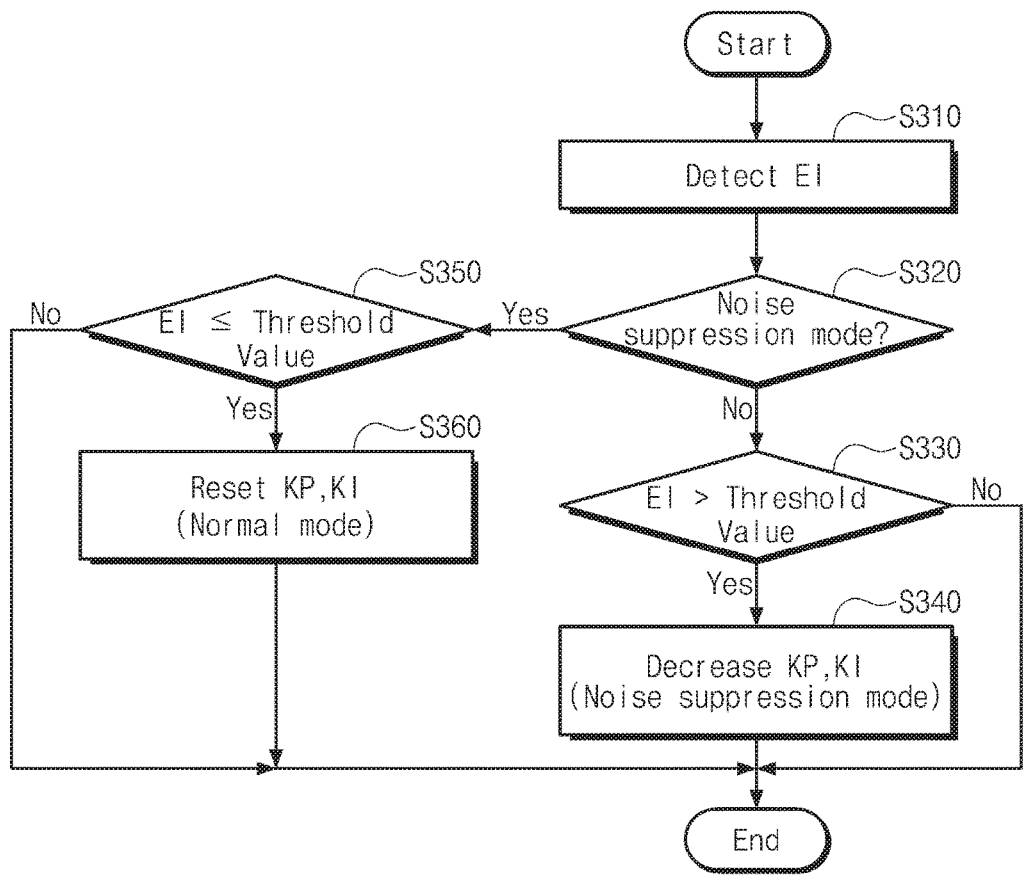
FIG. 21 is a flowchart illustrating an operating method of the digital phase locked loop of FIG. 20.

FIG. 21 is a flowchart illustrating an operating method of the digital phase locked loop 600 of FIG. 20.

Referring to FIGS. 20 and 21, in operation S310, the error detector 602 may detect the error information EI. The detected error information EI may be transferred to the logic 601.

In operation S320, the logic 601 determines whether a current operating mode is a noise suppression mode. If the current operating mode is the noise suppression mode, operation S350 is performed. If the current operating mode is not the noise suppression mode, operation S330 is performed.

If the current operating mode is the normal mode, in operation S330, the logic 601 may compare the error information EI with a threshold value. The threshold value may be stored (e.g., in advance) in the logic 601. The threshold value may be a value that is set in the logic 601 by an external device or a user. If the error information EI is not greater than the threshold value, the logic 601 may maintain the normal mode and may not change an operating mode.

If the error information EI is greater than the threshold value, in operation S340, the logic 601 may allow the digital phase locked loop 600 to enter the noise suppression mode. For example, the logic 601 may decrease the proportional gain KP and the integral gain KI while maintaining a ratio of the proportional gain KP to the integral gain KI. If the proportional gain KP and the integral gain KI decrease, a bandwidth of the second digital loop filter 582 (refer to FIG. 19) of the digital phase domain filter 680 decreases. Accordingly, more noises and spurs are blocked in the second digital loop filter 482.

If the current operating mode is the noise suppression mode, in operation S350, the logic 601 may determine whether the error information EI is the same as or smaller than the threshold value. If the error information EI is not the same as or smaller than the threshold value, the logic 601 may maintain the noise suppression mode and may not change an operating mode.

If the error information EI is the same as or smaller than the threshold value, in operation S360, the logic 601 may enter the normal mode. For example, the logic 601 may reset the proportional gain KP and the integral gain KI.

In some example embodiments, a description is given in FIGS. 18 and 20 as the logic 501 or 601 adjusts the proportional gain KP and the integral gain KI. In addition to the above description, the logic 501 or 601 may stepwise adjust the proportional gain KP and the integral gain KI. For example, in FIG. 20, the logic 601 may stepwise adjust (e.g., increase or decrease) the proportional gain KP and the integral gain KI depending on a range to which a value of the error information EI belongs.

In some example embodiments, the flowchart illustrated in FIG. 21 may be performed during one clock cycle (e.g., a clock cycle of the reference signal REF or the feedback signal FEED) in which the digital phase locked loop 600 operates. In a next clock cycle, the logic 601 may select an operating mode depending on the flowchart illustrated in FIG. 21.

In other example embodiments, the error detector 602 may accumulate the error information EI during the specific number of clock cycles in which the digital phase locked loop 600 operates. The logic 601 may select an operating mode depending on the accumulated error information EI. That is, the selection of the operating mode may be performed once during the specific number of clock cycles of the reference signal REF or the feedback signal FEED.

As described above, if the error information EI is greater than the threshold value, the logic 601 may allow the digital phase locked loop 600 to enter the noise suppression mode. If the error information EI is the same as or smaller than the threshold value, the logic 601 may allow the digital phase locked loop 600 to enter the normal mode.

Figure 22:
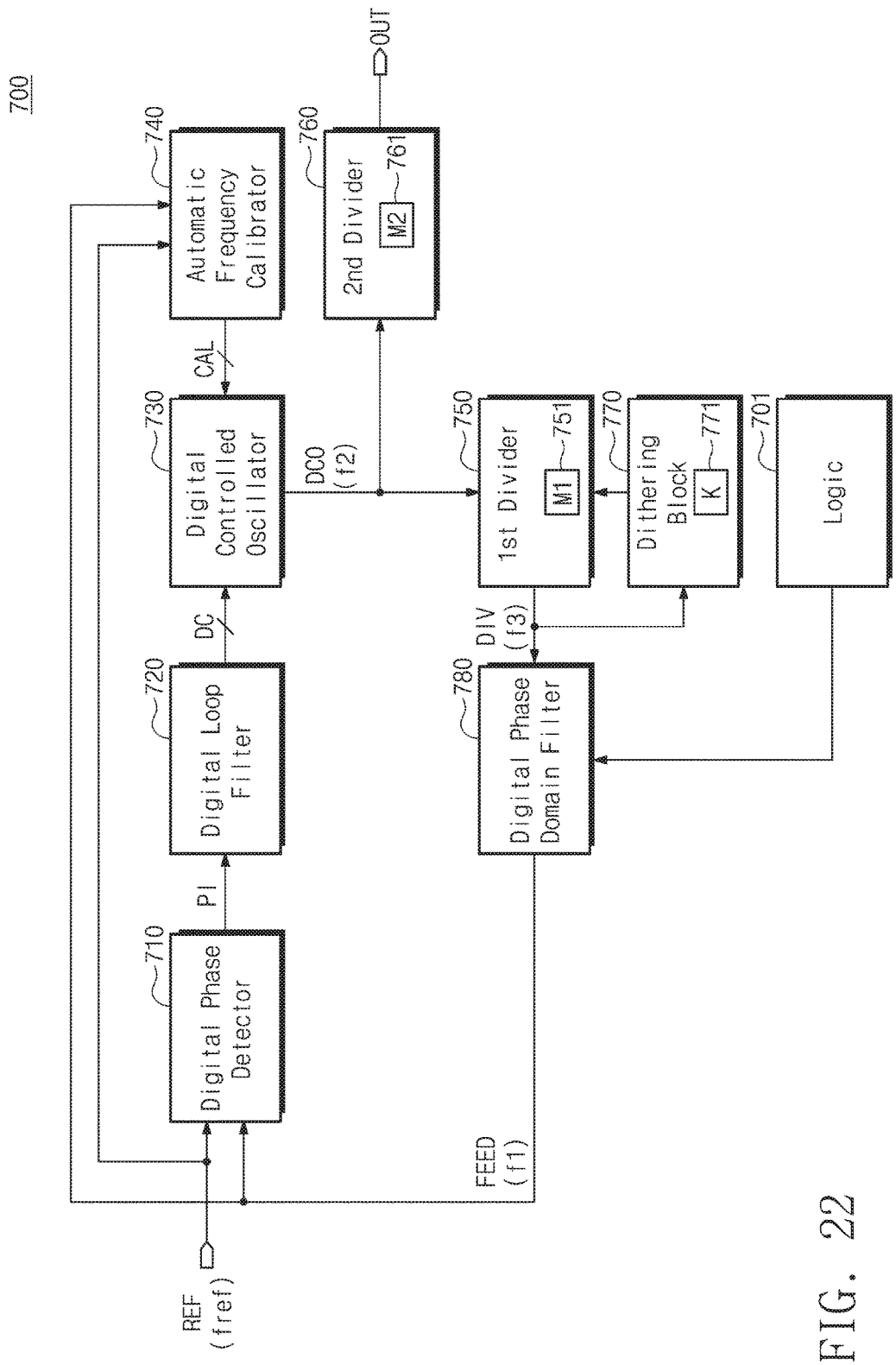
FIG. 22 is a block diagram illustrating the digital phase locked loop according to an application example of the digital phase locked loop of FIG. 18.

FIG. 22 is a block diagram illustrating a digital phase locked loop 700 according to other example embodiments of the inventive concepts.

Referring to FIG. 22, the digital phase locked loop 700 includes a digital phase detector 710, a digital loop filter 720, a digital controlled oscillator 730, an automatic frequency calibrator 740, a first divider 750, a second divider 760, a dithering block 770, a digital phase domain filter 780, and logic 701.

The first divider 750 may store the first division value M1 in storage 751. The second divider 760 may store the second division value M2 in storage 761. The dithering block 770 may store the control code "K" in storage 771.

Compared with FIG. 18, the digital phase locked loop 700 does not include the third divider 590. The logic 601 may adjust a bandwidth of the second digital loop filter 582 (refer to FIG. 19) of the digital phase domain filter 780. The digital phase locked loop 700 is the same as the digital phase locked loop 500 of FIG. 18 except that the third divider 590 is not provided, and a description thereof is thus omitted.

Figure 23:
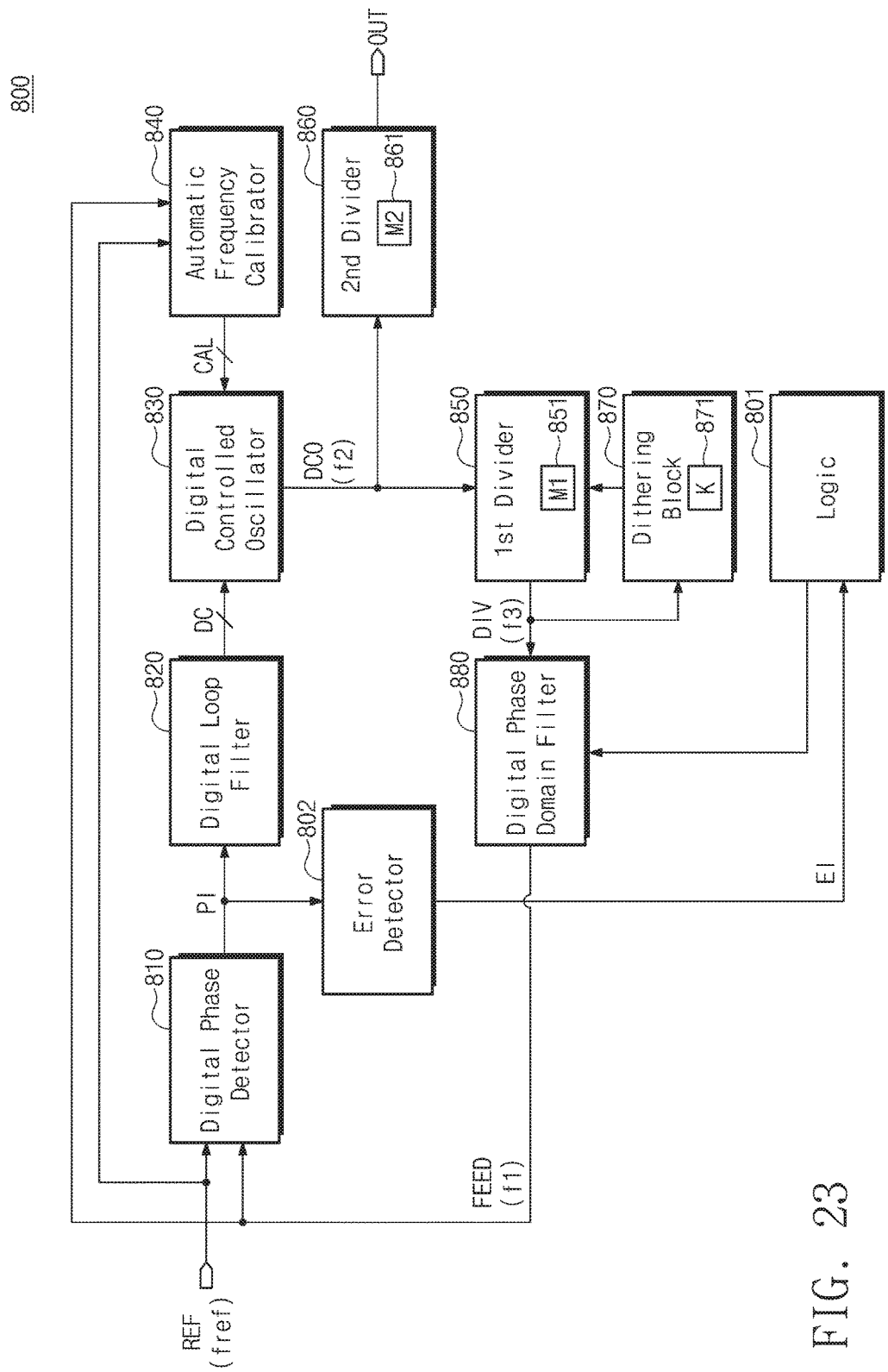
FIG. 23 is a block diagram illustrating the digital phase locked loop according to an application example of the digital phase locked loop of FIG. 20.

FIG. 23 is a block diagram illustrating a digital phase locked loop 800 according to other example embodiments of the inventive concepts Referring to FIG. 23, the digital phase locked loop 800 includes a digital phase detector 810, a digital loop filter 820, a digital controlled oscillator 830, an automatic frequency calibrator 840, a first divider 850, a second divider 860, a dithering block 870, a digital phase domain filter 480, logic 801, and an error detector 802.

The first divider 850 may store the first division value M1 in storage 851. The second divider 860 may store the second division value M2 in storage 861. The dithering block 870 may store the control code "K" in storage 871.

Compared with FIG. 20, the digital phase locked loop 800 does not include the third divider 690. The logic 801 may adjust a bandwidth of the second digital loop filter 582 (refer to FIG. 19) of the digital phase domain filter 880 depending on the error information EI. The digital phase locked loop 800 is the same as the digital phase locked loop 600 of FIG. 20 except that the third divider 690 is not provided, and a description thereof is thus omitted.

Figure 24:
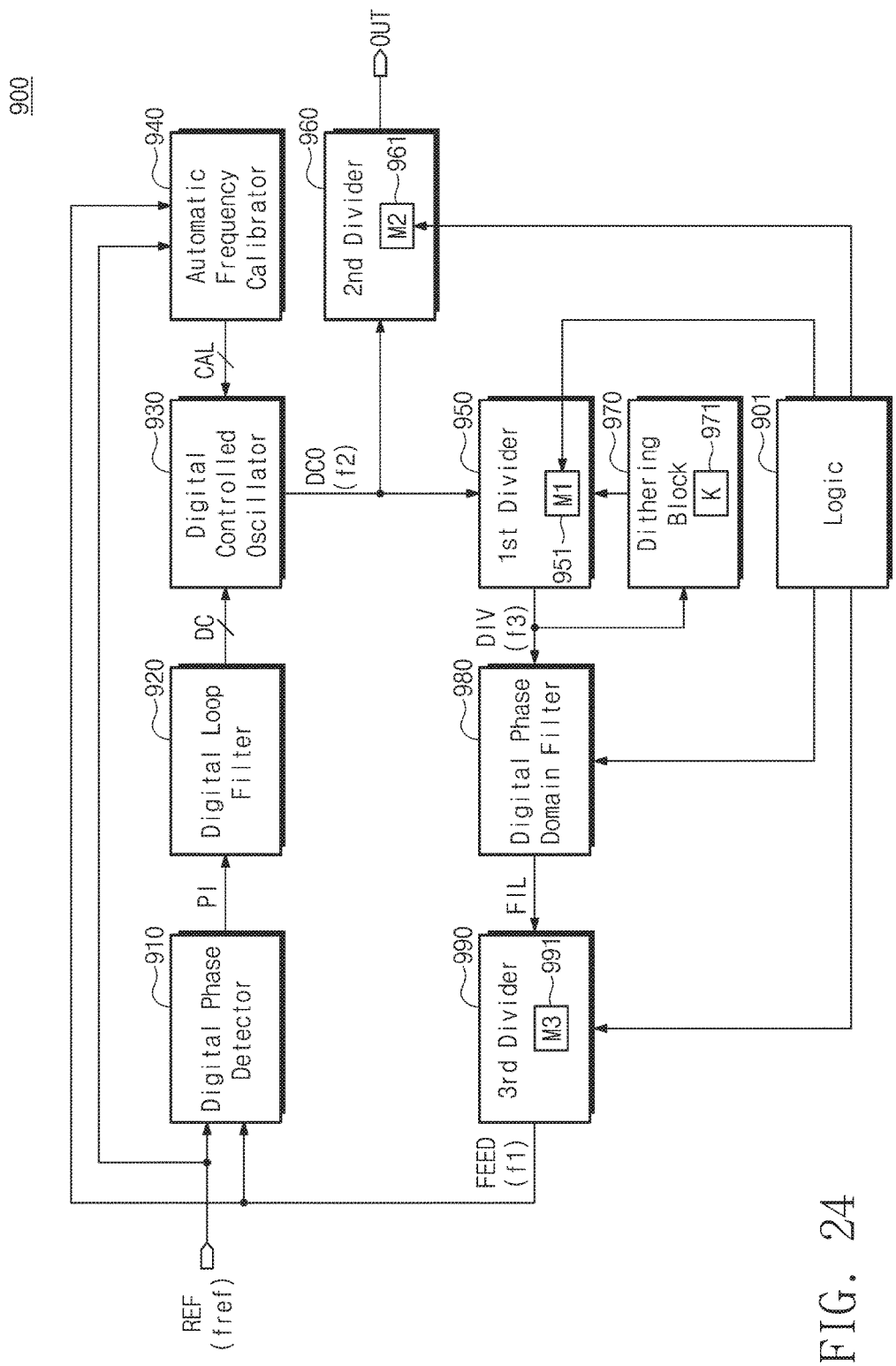
FIG. 24 is a block diagram illustrating the digital phase locked loop according to an application example of the digital phase locked loops of FIGS. 15 and 18.

FIG. 24 is a block diagram illustrating a digital phase locked loop 900 according to other example embodiments of the inventive concepts.

Referring to FIG. 24, the digital phase locked loop 900 includes a digital phase detector 910, a digital loop filter 920, a digital controlled oscillator 930, an automatic frequency calibrator 940, a first divider 950, a second divider 960, a dithering block 970, a digital phase domain filter 980, a third divider 990, and logic 901.

The first divider 950 may store the first division value M1 in storage 951. The second divider 960 may store the second division value M2 in storage 961. The dithering block 970 may store the control code "K" in storage 971. The third divider 990 may store the third division value M3 in storage 991.

As described with reference to FIG. 15, the logic 901 may adjust at least one of the first to third division values M1 to M3. Also, as described with reference to FIG. 18, the logic 901 may adjust a bandwidth of the second digital loop filter 582 (refer to FIG. 19) of the digital phase domain filter 980.

Figure 25:
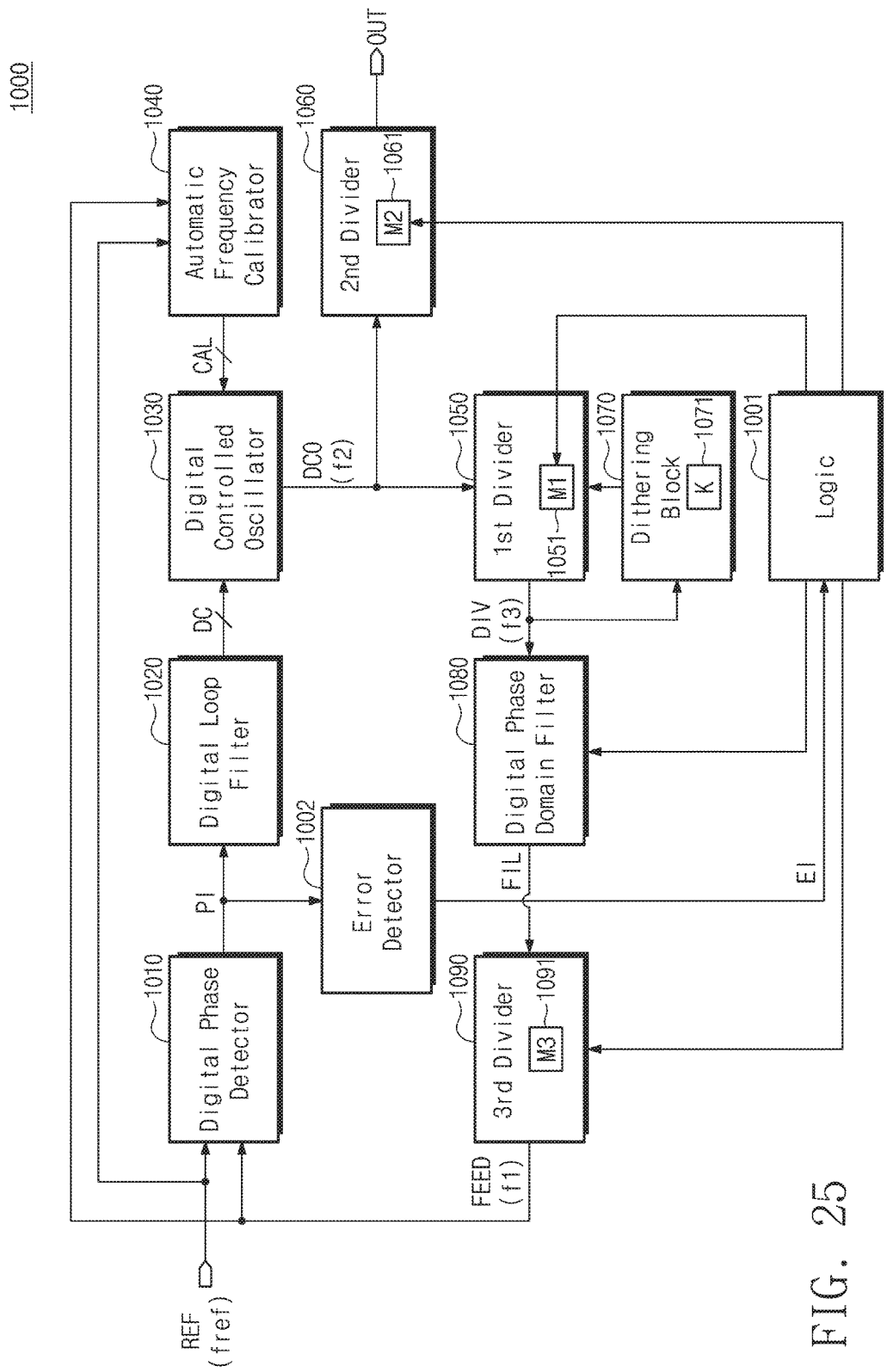
FIG. 25 is a block diagram illustrating the digital phase locked loop according to an application example of the digital phase locked loops of FIGS. 16 and 20.

FIG. 25 is a block diagram illustrating a digital phase locked loop 1000 according to other example embodiments of the inventive concepts.

Referring to FIG. 25, the digital phase locked loop 1000 includes a digital phase detector 1010, a digital loop filter 1020, a digital controlled oscillator 1030, an automatic frequency calibrator 1040, a first divider 1050, a second divider 1060, a dithering block 1070, a digital phase domain filter 1080, a third divider 1090, logic 1001, and an error detector 1002.

The first divider 1050 may store the first division value M1 in storage 1051. The second divider 1060 may store the second division value M2 in storage 1061. The dithering block 1070 may store the control code "K" in storage 1071. The third divider 1090 may store the third division value M3 in storage 1091.

As described with reference to FIG. 16, the logic 1001 may adjust at least one of the first to third division values M1 to M3 depending on the error information EI. Also, as described with reference to FIG. 20, the logic 1001 may adjust a bandwidth of the second digital loop filter 582 (refer to FIG. 19) of the digital phase domain filter 1080 depending on the error information EI.

Figure 26:
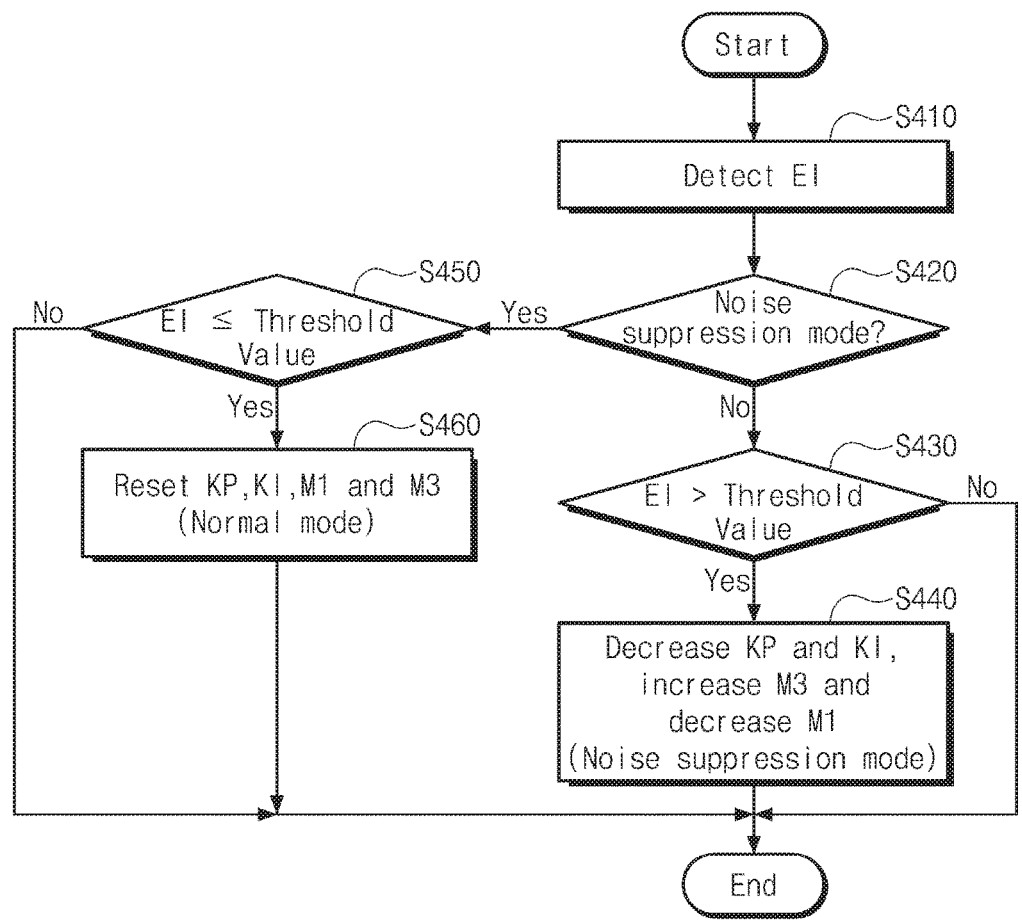
FIG. 26 is a flowchart illustrating an operating method of the digital phase locked loop of FIG. 25.

FIG. 26 is a flowchart illustrating an operating method of the digital phase locked loop 1000 of FIG. 25.

Referring to FIGS. 25 and 26, in operation S410, the error detector 1002 may detect the error information EI. The detected error information EI may be transferred to the logic 1001.

In operation S420, the logic 1001 determines whether a current operating mode is a noise suppression mode. If the current operating mode is the noise suppression mode, operation S450 is performed. If the current operating mode is not the noise suppression mode, operation S430 is performed.

If the current operating mode is the normal mode, in operation S430, the logic 1001 may compare the error information EI with a threshold value. The threshold value may be stored (e.g., in advance) in the logic 1001. The threshold value may be a value that is set in the logic 1001 by an external device or a user. If the error information EI is not greater than the threshold value, the logic 1001 may maintain the normal mode and may not change an operating mode.

If the error information EI is greater than the threshold value, in operation S440, the logic 1001 may allow the digital phase locked loop 1000 to enter the noise suppression mode. For example, the logic 1001 may reduce a bandwidth by decreasing the proportional gain KP and the integral gain KI while maintaining a ratio of the proportional gain KP to the integral gain KI. Also, while maintaining a product of the first and third division values M1 and M3, the logic 1001 may increase the third division value M3 and may decrease the first division value M1.

If the current operating mode is the noise suppression mode, in operation S450, the logic 1001 may determine whether the error information EI is the same as or smaller than the threshold value. If the error information EI is not the same as or smaller than the threshold value, the logic 1001 may maintain the noise suppression mode and may not change an operating mode.

If the error information EI is the same as or smaller than the threshold value, in operation S460, the logic 1001 may enter the normal mode. For example, the logic 1001 may reset the proportional gain KP and the integral gain KI.

In some example embodiments, a description is given in FIGS. 24 and 25 as the logic 901 or 1001 adjusts the proportional gain KP, the integral gain KI, and the first and third division values M1 and M3. In addition to the above description, the logic 901 or 1001 may stepwise adjust the proportional gain KP, the integral gain KI, and the first and third division values M1 and M3. For example, in FIG. 25, the logic 1001 may stepwise adjust (e.g., increase or decrease) the proportional gain KP, the integral gain KI, and the first and third division values M1 and M3 depending on a range to which a value of the error information EI belongs.

In some example embodiments, a description is given in FIGS. 24 and 25 as the logic 901 or 1001 adjusts the proportional gain KP, the integral gain KI, and the first and third division values M1 and M3 together. However, the logic 901 or 1001 may adjust the proportional gain KP and the integral gain KI independently of the first and third division values M1 and M3. Also, the logic 901 or 1001 may adjust the first and third division values M1 and M3 independently of the proportional gain KP and the integral gain KI.

In some example embodiments, the logic 901 or 1001 may determine whether to adjust the proportional gain KP and the integral gain KI or whether to adjust the first and third division values M1 and M3, depending on a request of an external device, a control of a user, or an internal algorithm. For example, in FIG. 25, the logic 901 or 1001 may determine whether to adjust the proportional gain KP and the integral gain KI or whether to adjust the first and third division values M1 and M3, depending on the error information EI.

In some example embodiments, the flowchart illustrated in FIG. 26 may be performed during one clock cycle (e.g., a clock cycle of the reference signal REF or the feedback signal FEED) in which the digital phase locked loop 1000 operates. In a next clock cycle, the logic 1001 may select an operating mode depending on the flowchart illustrated in FIG. 25.

In other example embodiments, the error detector 1002 may accumulate the error information EI during the specific number of clock cycles in which the digital phase locked loop 1000 operates. The logic 1001 may select an operating mode depending on the accumulated error information EI. That is, the selection of the operating mode may be performed once during the specific number of clock cycles of the reference signal REF or the feedback signal FEED.

As described above, if the error information EI is greater than the threshold value, the logic 1001 may allow the digital phase locked loop 1000 to enter the noise suppression mode. If the error information EI is the same as or smaller than the threshold value, the logic 1001 may allow the digital phase locked loop 1000 to enter the normal mode.

Figure 27:
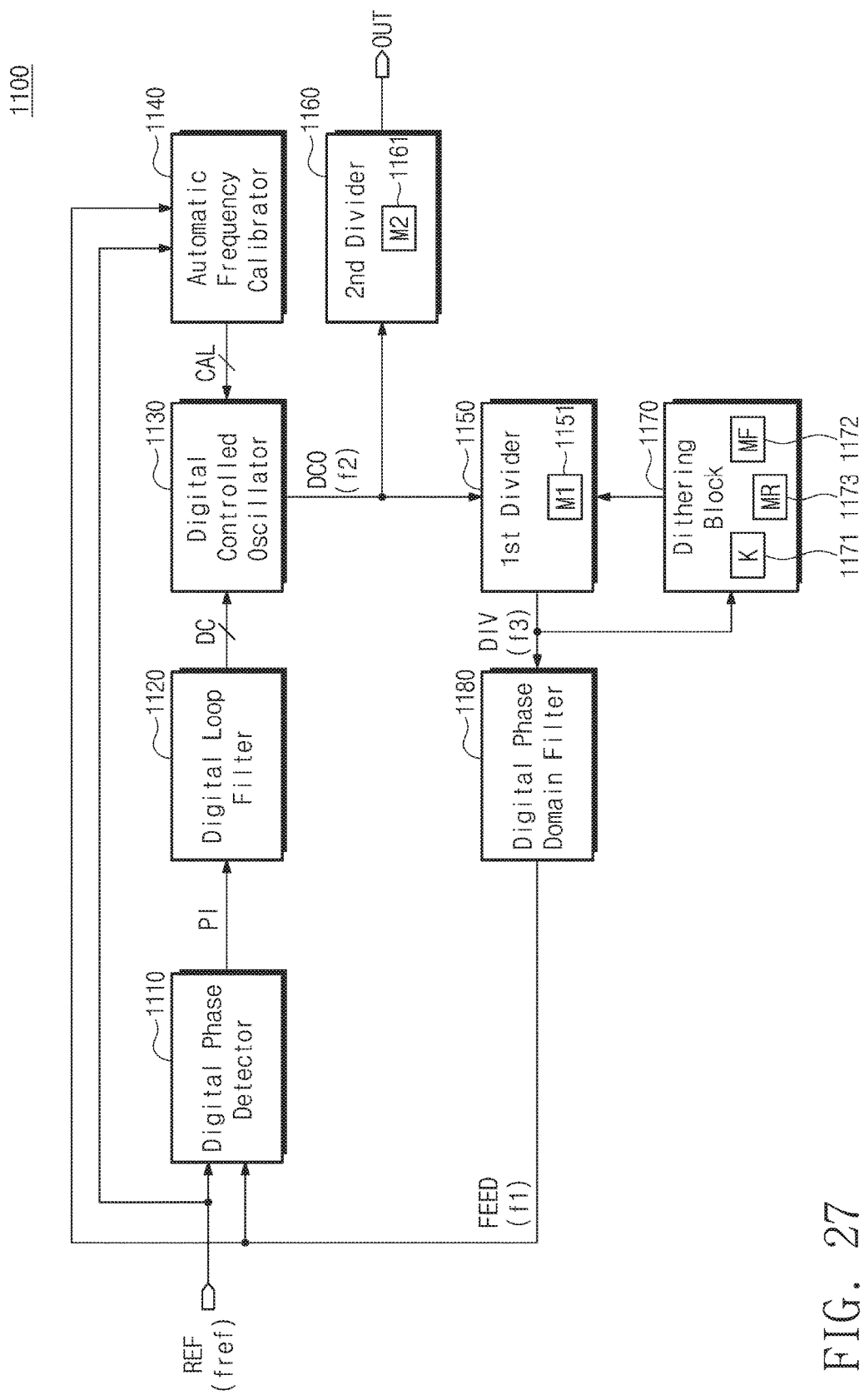
FIG. 27 illustrates an application example of the digital phase locked loop of FIG. 1.

FIG. 27 illustrates a digital phase locked loop according to other example embodiments of the inventive concepts.

Referring to FIG. 27, a digital phase locked loop 1100 includes a digital phase detector 1110, a digital loop filter 1120, a digital controlled oscillator 1130, an automatic frequency calibrator 1140, a first divider 1150, a second divider 1160, a dithering block 1170, and a digital phase domain filter 1180.

The first divider 1150 may store the first division value M1 in storage 1151. The second divider 1160 may store the second division value M2 in storage 1161. The dithering block 1170 may store the control code "K" in storage 1171.

Compared with the dithering block 170 of the digital phase locked loop 100 of FIG. 1, the dithering block 1170 of the digital phase locked loop 1100 may further store information of a modulation frequency MF and a modulation ratio MR in storages 1172 and 1173. The dithering block 1170 may modulate the third frequency f3 of the division signal DIV depending on the modulation frequency MF and the modulation ratio MR.

Figure 28:
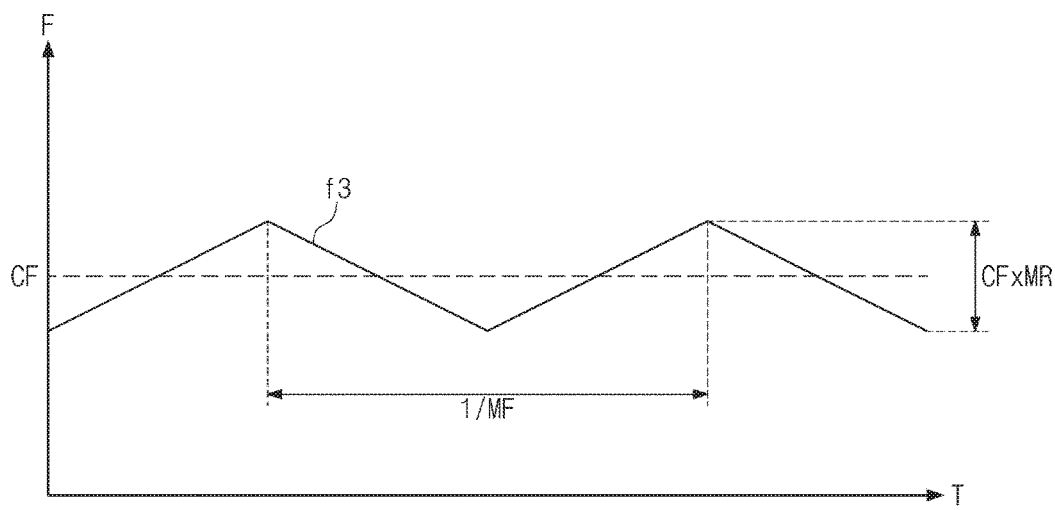
FIG. 28 illustrates an example in which a third frequency of a division signal is modulated by a dithering block.

FIG. 28 illustrates an example in which the third frequency f3 of the division signal DIV is modulated by the dithering block 1170. In FIG. 28, a horizontal axis represents a time "T", and a vertical axis represents a frequency "F".

Referring to FIGS. 27 and 28, the third frequency f3 may vary with respect to the center frequency CF. The center frequency CF may be a frequency where the third frequency f3 is not modulated.

For example, the third frequency f3 may vary with a periodic pattern depending on the modulation. A period of the pattern that the third frequency f3 varies may correspond to a reciprocal of the modulation frequency MF. A variation (or a variation range) of the third frequency f3 may be determined depending on the modulation ratio MR. For example, the third frequency f3 may vary with respect to the center frequency CF as much as a product of the center frequency CF and the modulation ratio MR.

In some example embodiments, the third frequency f3 is illustrated in FIG. 28 as decreasing from the highest point to the lowest point with a fixed slope and increasing from the lowest point to the highest point with the fixed slope. However, a pattern of the third frequency f3, for example, a waveform of the third frequency f3 is not limited to illustration of FIG. 28. The pattern (or waveform) of the third frequency f3 may be variously applied and modified while satisfying the modulation frequency MF and the modulation ratio MR.

In some example embodiments, a frequency response of the digital phase locked loop 100 is described with reference to the fourth line L4 of FIG. 8. As described with reference to FIGS. 27 and 28, if the third frequency f3 is modulated based on the modulation frequency MF and the modulation ratio MR, a portion of the frequency response, which corresponds to the center frequency CF, may be further spread. For example, power of a portion corresponding to the center frequency CF may decrease, and power of a portion adjacent to the center frequency CF may increase.

If the third frequency f3 is modulated depending on the modulation frequency MF and the modulation ratio MR, electromagnetic Interference (EMI) caused from the digital phase locked loop 1100 decreases. If a frequency varies in a general digital phase locked loop, phase locking may fail due to noises and spurs.

The digital phase locked loop 1100 according to some example embodiments of the inventive concepts may perform filtering in a phase domain by using the digital phase domain filter 1180. Accordingly, as illustrated in FIG. 28, even though a frequency is modulated, the digital phase locked loop 1100 may perform normally phase locking. That is, the digital phase locked loop 1100 may be implemented with a digital circuit such that complexity is reduced, may perform phase locking linearly through filtering in a phase domain, and may reduce the electromagnetic interference through frequency modulation.

The digital phase locked loop 1100 described with reference to FIG. 27 may be combined with the digital phase locked loops 100 to 1100 described with reference to FIGS. 1 to 26. For example, the dithering block 170 of the digital phase locked loop 100 of FIG. 1, the dithering block 270 of the digital phase locked loop 200 of FIG. 14, and the dithering block 370 of the digital phase locked loop 300 of FIG. 15 may modulate the third frequency f3 depending on the modulation frequency MF and the modulation ratio MR.

The dithering block 470 of the digital phase locked loop 400 of FIG. 16, the dithering block 570 of the digital phase locked loop 500 of FIG. 18, the dithering block 670 of the digital phase locked loop 600 of FIG. 20, the dithering block 770 of the digital phase locked loop 700 of FIG. 22, the dithering block 870 of the digital phase locked loop 800 of FIG. 23, the dithering block 970 of the digital phase locked loop 900 of FIG. 24, and the dithering block 1070 of the digital phase locked loop 1000 of FIG. 25 may also modulate the third frequency f3 depending on the modulation frequency MF and the modulation ratio MR.

Figure 29:
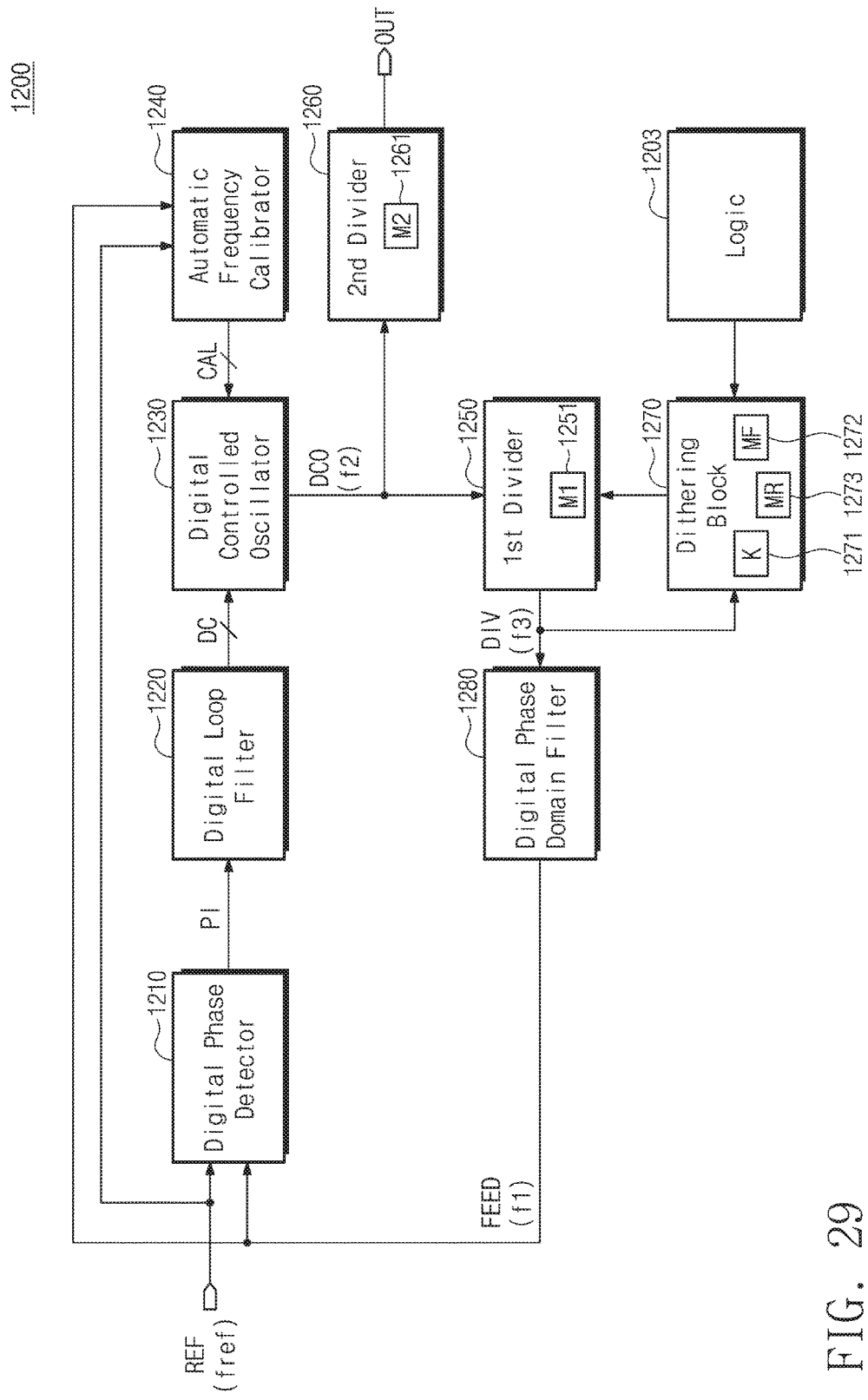
FIG. 29 illustrates an application example of the digital phase locked loop of FIG. 27.

FIG. 29 illustrates a digital phase locked loop according to other example embodiments of the inventive concepts.

Referring to FIG. 29, a digital phase locked loop 1200 includes a digital phase detector 1210, a digital loop filter 1220, a digital controlled oscillator 1230, an automatic frequency calibrator 1240, a first divider 1250, a second divider 1260, a dithering block 1270, a digital phase domain filter 1280, and logic 1203.

The first divider 1250 may store the first division value M1 in storage 1251. The second divider 1260 may store the second division value M2 in storage 1261. The dithering block 1270 may store the control code "K" in storage 1271.

Compared with the digital phase locked loop 1100 of FIG. 27, the digital phase locked loop 1200 further includes the logic 1203. The logic 1203 may determine whether to modulate the third frequency f3. If modulation of the third frequency f3 is determined, the logic 1203 may adjust at least one of the modulation frequency MF and the modulation ratio MR. For example, the logic 1203 may adjust one of the modulation frequency MF and the modulation ratio MR depending on an internally given algorithm.

The logic 1203 may determine whether to modulate the third frequency f3 depending on a change in environment. For example, the logic 1203 may determine whether to modulate the third frequency f3, at a time zone set by a user, when a request is received from an external device, or when a temperature is higher or lower than a threshold value. The logic 1203 may activate and deactivate modulation periodically depending on a time interval set by a user or depending on a time interval obtained by calculation.

If modulation of the third frequency f3 is determined, the logic 1203 may adjust at least one of the modulation frequency MF and the modulation ratio MR depending on a change in environment. For example, the logic 1203 may increase or decrease at least one of the modulation frequency MF and the modulation ratio MR, at a time zone set by a user, when a request is received from an external device, or when a temperature is higher or lower than a threshold value. The logic 1203 may increase or decrease at least one of the modulation frequency MF and the modulation ratio MR periodically depending on a time interval set by a user or depending on a time interval obtained by calculation.

The digital phase locked loop 1100 described with reference to FIG. 27 may be combined with the digital phase locked loops 100 to 1100 described with reference to FIGS. 1 to 26. For example, the dithering block 170 of the digital phase locked loop 100 of FIG. 1, the dithering block 270 of the digital phase locked loop 200 of FIG. 14, and the dithering block 370 of the digital phase locked loop 300 of FIG. 15 may modulate the third frequency f3 depending on the modulation frequency MF and the modulation ratio MR.

Logic that determines whether to modulate and adjusts at least one of the modulation frequency MF and the modulation ratio MR may be added to the digital phase locked loops 100 to 300. In the digital phase locked loop 300 of FIG. 15, a function of determining whether to modulate and adjusting at least one of the modulation frequency MF and the modulation ratio MR may be added to the logic 301. As another example, in the digital phase locked loop 300 of FIG. 15, additional logic of determining whether to modulate and adjusting at least one of the modulation frequency MF and the modulation ratio MR may be provided independently of the logic 301.

The dithering block 470 of the digital phase locked loop 400 of FIG. 16, the dithering block 570 of the digital phase locked loop 500 of FIG. 18, the dithering block 670 of the digital phase locked loop 600 of FIG. 20, the dithering block 770 of the digital phase locked loop 700 of FIG. 22, the dithering block 870 of the digital phase locked loop 800 of FIG. 23, the dithering block 970 of the digital phase locked loop 900 of FIG. 24, and the dithering block 1070 of the digital phase locked loop 1000 of FIG. 25 may also modulate the third frequency f3 depending on the modulation frequency MF and the modulation ratio MR.

Logic that determines whether to modulate and adjusts at least one of the modulation frequency MF and the modulation ratio MR may be added to the digital phase locked loops 400 to 1000. In the digital phase locked loops 401 to 1000, a function of determining whether to modulate and adjusting at least one of the modulation frequency MF and the modulation ratio MR may be added to the logics 401 to 1001. As another example, in the digital phase locked loops 400 to 1000, addition logic that determines whether to modulate and adjusts at least one of the modulation frequency MF and the modulation ratio MR may be added independently of the logics 401 to 1001.

In the digital phase locked loops 400, 600, 800, and 1000 of FIGS. 4, 20, 23, and 25, whether to modulate and whether to adjust at least one of the modulation frequency MF and the modulation ratio MR may be determined based on the error information EI. For example, when an error rate that the error information EI indicates is greater or smaller than a first threshold value, the modulation may be activated or deactivated. When the error rate is greater or smaller than a second threshold value, at least one of the modulation frequency MF and the modulation ratio MR may increase or decrease.

In the above-described embodiments, components according to embodiments of the inventive concept are referred to by using the term "block" or "logic.". The "block" or "logic" may be implemented with various hardware devices, such as an integrated circuit, an application specific IC (ASCI), a field programmable gate array (FPGA), and a complex programmable logic device (CPLD), software, such as firmware and applications driven in hardware devices, or a combination of a hardware device and software. Also, the "block" or "logic" may include circuits or intellectual property (IP) implemented with semiconductor devices.

For example, in some example embodiments, the digital phase locked loop may be implemented by a processor and a memory (not shown).

The memory may include a non-transitory computer readable medium. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The non-transitory computer-readable media may also be a distributed network, so that the program instructions are stored and executed in a distributed fashion.

The processor may be an arithmetic logic unit, a digital signal processor, a microcomputer, a field programmable array, a programmable logic unit, a microprocessor or any other device capable of responding to and executing instructions in a defined manner.

The memory may contain instructions that, when executed by the processor, configure the processor as a special purpose computer to perform the functions of a digital phase locked loop according to example embodiments such that the digital phase locked loop is configured to perform second low pass filtering on a division signal in a phase domain to generate a feedback signal, where the division signal is a signal that is divided based on a second division value that is dithered to increase a lock-up speed of the digital phase locked loop. Therefore, the processor may improve the functioning and reliability of the digital phase locked loop itself by suppressing noise and spurs generated due to the dithering.

According to example embodiments of the inventive concepts, a digital phase domain filter is provided in a digital phase locked loop. The digital phase domain filter suppresses a noise and a spur generated by dithering. Accordingly, there are provided the digital phase locked loop in which noises and spurs of an in-band and an out-band are reduced and an operating method of the digital phase locked loop.

While example embodiments of the inventive concepts have been described with reference to some example embodiments, it will be apparent to those skilled in the art that various changes and modifications may be made without departing from the spirit and scope of the example embodiments of the inventive concepts. Therefore, it should be understood that the above example embodiments are not limiting, but illustrative.

What is claimed is:

1. A digital phase locked loop comprising:
a digital phase detector configured to output phase information based on a phase of a reference signal having a reference frequency and a phase of a feedback signal having a first frequency such that the phase information indicates whether the phase of the feedback signal is advanced or delayed with respect to the phase of the reference signal;
a digital loop filter configured to perform first low pass filtering on the phase information in a frequency domain, and the digital loop filter configured to output a result of the first low pass filtering as a digital code;
a digital controlled oscillator configured to output an oscillation signal having a second frequency, and the digital controlled oscillator configured to adjust a frequency of the oscillation signal based on the digital code;
a first divider configured to perform a first division to divide the second frequency of the oscillation signal based on a first division value, and the first divider configured to output a result of the first division as a division signal having a third frequency;
a second divider configured to perform a second division to divide the second frequency of the oscillation signal based on a second division value, and the second divider configured to output a result of the second division as an output signal having a final frequency;
a dithering block configured to perform, in cycles of the division signal, dithering on the first division value based on a pattern; and
a digital phase domain filter configured to perform second low pass filtering on the division signal in a phase domain, and the digital phase domain filter configured to output a result of the second low pass filtering as the feedback signal.

2. The digital phase locked loop of claim 1, wherein the digital phase domain filter comprises:
a second digital phase detector configured to output second phase information based on a phase of the division signal and the phase of the feedback signal such that the second phase information indicates whether the phase of the feedback signal is advanced or delayed with respect to the phase of the division signal;
a second digital loop filter configured to perform third low pass filtering on the second phase information in the frequency domain, and the second digital loop filter configured to output a result of the third low pass filtering as a second digital code; and
a second digital controlled oscillator configured to adjust the first frequency of the feedback signal based on the second digital code.

3. The digital phase locked loop of claim 2, wherein the digital phase detector and the second digital phase detector have a same structure.

4. The digital phase locked loop of claim 2, wherein the digital loop filter and the second digital loop filter have a same structure.

5. The digital phase locked loop of claim 2, wherein a first frequency range of the digital controlled oscillator is higher than a second frequency range of the second digital controlled oscillator.

6. The digital phase locked loop of claim 2, wherein the second digital loop filter comprises:
a first amplifier configured to apply a first gain to the second phase information;
a second amplifier configured to apply a second gain to the second phase information;
an accumulator configured to accumulate outputs of the second amplifier; and
an adder configured to generate the second digital code by adding an output of the first amplifier and an output of the accumulator.

7. The digital phase locked loop of claim 6, further comprising:
logic configured to adjust the first gain of the first amplifier and the second gain of the second amplifier.

8. The digital phase locked loop of claim 7, further comprising:
an error detector configured to detect an error in the output signal by analyzing the phase information, and to generate error information based on the error, wherein the logic is configured to adjust the first gain and the second gain based on the error information.

9. The digital phase locked loop of claim 8, wherein
in a normal mode, if an amount of the error is greater than a threshold value, the logic is configured to enter a noise suppression mode to decrease the first gain and the second gain; and
in the noise suppression mode, if the amount of the error is less than or equal to the threshold value, the logic is configured to enter the normal mode to reset the first gain and the second gain.

10. The digital phase locked loop of claim 1, wherein the dithering block is configured to,
store information about a modulation frequency and a modulation ratio, and
selectively instruct the first divider to modulate the third frequency of the division signal based on the modulation frequency and the modulation ratio.

11. A digital phase locked loop comprising:
a digital phase detector configured to output phase information based on a phase of a reference signal having a reference frequency and a phase of a feedback signal having a first frequency such that the phase information indicates whether the phase of the feedback signal is advanced or delayed with respect to the phase of the reference signal;
a digital loop filter configured to perform first low pass filtering on the phase information in a frequency domain, and the digital loop filter configured to output a result of the first low pass filtering as a digital code;
a digital controlled oscillator configured to output an oscillation signal having a second frequency, and the digital controlled oscillator configured to adjust a frequency of the oscillation signal depending on the digital code;
a first divider configured to perform a first division to divide the second frequency of the oscillation signal based on a first division value, and the first divider configured to output a result of the first division as a division signal having a third frequency;
a second divider configured to perform a second division to divide the second frequency of the oscillation signal based on a second division value, and the second divider configured to output a result of the second division as an output signal having a final frequency;

a dithering block configured to perform dithering, in cycles of the division signal, on the first division value based on a pattern;

a digital phase domain filter configured to perform second low pass filtering on the division signal in a phase domain, and the digital phase domain filter configured to output the result of the second low pass filtering as a filtered signal; and a third divider configured to perform a third division to divide a frequency of the filtered signal based on a third division value, and the third divider configured to output a result of the third division as the feedback signal.

12. The digital phase locked loop of claim 11, further comprising:

logic configured to adjust at least one of the first division value, the second division value, and the third division value.

13. The digital phase locked loop of claim 12, wherein the logic is configured to adjust the first division value and the third division value such that a product of the first division value and the third division value is uniform.

14. The digital phase locked loop of claim 12, further comprising:

an error detector configured to detect an error in the output signal by analyzing the phase information, wherein
the logic is configured to adjust the first division value and the third division value based on the error.

15. The digital phase locked loop of claim 14, wherein in a normal mode, if an amount of the error is less than a threshold value, the logic is configured to enter a power saving mode to decrease the third division value and increase the first division value.

16. The digital phase locked loop of claim 15, wherein in the power saving mode, if the amount of the error is greater than or equal to the threshold value, the logic is configured to enter the normal mode to reset the first division value and the third division value.

17. The digital phase locked loop of claim 12, wherein the digital phase domain filter comprises:

a second digital phase detector configured to output second phase information based on a phase of the division signal and the phase of the feedback signal such that the second phase information indicates whether the phase of the feedback signal is advanced or delayed with respect to the phase of the division signal;

a second digital loop filter configured to perform third low pass filtering on the second phase information in the frequency domain, and the second digital loop filter configured to output a result of the third low pass filtering as a second digital code, the second digital loop filter including a first amplifier, a second amplifier, an accumulator and an adder, the first amplifier configured to apply a first gain to the second phase information, the second amplifier configured to apply a second gain to the second phase information, the accumulator configured to accumulate outputs of the second amplifier, and the adder configured to perform an addition to add an output of the first amplifier and an output of the accumulator and to output a result of the addition as the second digital code; and a second digital controlled oscillator configured to adjust the first frequency of the feedback signal based on the second digital code.

18. The digital phase locked loop of claim 17, wherein the logic is further configured to adjust the first gain of the first amplifier and the second gain of the second amplifier.

19. The digital phase locked loop of claim 18, further comprising:

an error detector configured to detect an error in the output signal by analyzing the phase information, wherein
in a normal mode, if an amount of the error is greater than a threshold value, the logic is configured to enter a noise suppression mode to decrease the first division value, increase the third division value, and decrease the first gain and the second gain, and
in the noise suppression mode, if the amount of the error is less than or equal to the threshold value, the logic is configured to enter the normal mode to reset the first division value, the third division value, the first gain, and the second gain.

20. A method of operating a digital phase locked loop, the method comprising:

generating phase information based on a phase of a reference signal having a reference frequency and a phase of a feedback signal having a first frequency such that the phase information indicates whether the phase of the feedback signal is advanced or delayed with respect to the phase of the reference signal, accumulating, at a digital loop filter of the digital phase locked loop, the phase information to generate a digital code;

outputting, at a digital controlled oscillator of the digital phase locked loop, an oscillation signal based on the digital code;

performing, at a first divider of the digital phase locked loop, dithering on a first division value and dividing a frequency of the oscillation signal based on the first division value to output a division signal; and performing, at a digital phase domain filter of the digital phase locked loop, low pass filtering on the division signal to generate a next feedback signal of a next clock cycle.

* * * * *